United States Patent
Lederer et al.

(10) Patent No.: US 11,787,965 B2
(45) Date of Patent: Oct. 17, 2023

(54) INK COMPOSITION FOR FORMING AN ORGANIC LAYER OF A SEMICONDUCTOR

(71) Applicant: Novaled GmbH, Dresden (DE)

(72) Inventors: Kay Lederer, Dresden (DE); Steffen Runge, Dresden (DE); Jerome Ganier, Dresden (DE); Anke Limbach, Dresden (DE)

(73) Assignee: Novaled GmbH, Dresden (DE)

( * ) Notice: Subject to any disclaimer, the term of this patent is extended or adjusted under 35 U.S.C. 154(b) by 479 days.

(21) Appl. No.: 16/497,879

(22) PCT Filed: Mar. 29, 2018

(86) PCT No.: PCT/EP2018/058154
§ 371 (c)(1),
(2) Date: Sep. 26, 2019

(87) PCT Pub. No.: WO2018/178273
PCT Pub. Date: Oct. 4, 2018

(65) Prior Publication Data
US 2020/0032093 A1    Jan. 30, 2020

(30) Foreign Application Priority Data
Mar. 30, 2017   (EP) .................................... 17163956

(51) Int. Cl.
*C09D 11/52*    (2014.01)
*C09D 11/102*   (2014.01)
(Continued)

(52) U.S. Cl.
CPC ............ *C09D 11/52* (2013.01); *C09D 11/102* (2013.01); *C09D 11/38* (2013.01); *H10K 39/10* (2023.02);
(Continued)

(58) Field of Classification Search
CPC ............ H01L 27/3276; H01L 27/1222; H01L 27/1225; H01L 27/1255; H01L 27/3258;
(Continued)

(56) References Cited

U.S. PATENT DOCUMENTS 4,959,297 A  *  9/1990  Palazzotto  .............. G03F 7/029
                                                                522/15
6,336,963 B1 *  1/2002  Malhotra  ............... C09D 11/34
                                                                523/160
(Continued)

FOREIGN PATENT DOCUMENTS

CN   101705089   *  5/2010
CN   104685648 A    6/2015
(Continued)

OTHER PUBLICATIONS

Surfactants, Industrial Applications, in Encyclopedia of Physical Science and Technology (Third Edition), Tharwat F. Tadros (Year: 2003).*

(Continued)

*Primary Examiner* — Sheng-Bai Zhu
(74) *Attorney, Agent, or Firm* — Eversheds Sutherland (US) LLP

(57) ABSTRACT

The present invention is directed to an ink composition for forming an organic semiconductor layer, wherein the ink composition comprises: —at least one p-type dopant comprising electron withdrawing groups; —at least one first auxiliary compound, wherein the first auxiliary compound is an aromatic nitrile compound, wherein the aromatic nitrile compound has about ≥1 to about ≤3 nitrile groups and a melting point of about <100° C., wherein the first auxiliary compound is different from the p-type dopant; and wherein the electron withdrawing groups are fluorine, chlorine, bromine and/or nitrile.

19 Claims, 9 Drawing Sheets

(51) Int. Cl.
| | |
|---|---|
| *C09D 11/38* | (2014.01) |
| *H01L 27/30* | (2006.01) |
| *H01L 27/32* | (2006.01) |
| *H01L 51/00* | (2006.01) |
| *H01L 51/50* | (2006.01) |
| *H10K 39/10* | (2023.01) |
| *H10K 59/122* | (2023.01) |
| *H10K 59/173* | (2023.01) |
| *H10K 85/60* | (2023.01) |
| *H10K 85/10* | (2023.01) |
| *H10K 85/30* | (2023.01) |
| *H10K 50/11* | (2023.01) |
| *H10K 50/17* | (2023.01) |
| *H10K 50/155* | (2023.01) |
| *H10K 71/13* | (2023.01) |
| *H10K 101/30* | (2023.01) |
| *H10K 101/40* | (2023.01) |
| *H10K 102/00* | (2023.01) |

(52) U.S. Cl.
CPC ......... *H10K 59/122* (2023.02); *H10K 59/173* (2023.02); *H10K 85/115* (2023.02); *H10K 85/151* (2023.02); *H10K 85/341* (2023.02); *H10K 85/60* (2023.02); *H10K 85/615* (2023.02); *H10K 50/11* (2023.02); *H10K 50/155* (2023.02); *H10K 50/17* (2023.02); *H10K 71/135* (2023.02); *H10K 2101/30* (2023.02); *H10K 2101/40* (2023.02); *H10K 2102/361* (2023.02)

(58) Field of Classification Search
CPC ....... H01L 27/124; H01L 27/32; H01L 27/30; H01L 51/00; H01L 51/0007; C09D 11/52; C09D 11/38; C09D 11/102
USPC .......................................................... 438/46
See application file for complete search history.

(56) References Cited

U.S. PATENT DOCUMENTS

| | | | |
|---|---|---|---|
| 10,566,550 B2 | 2/2020 | Eckes et al. | |
| 2010/0279001 A1* | 11/2010 | Shin ...................... | B82Y 20/00 570/183 |
| 2012/0256136 A1* | 10/2012 | Cheon ................... | C09D 11/36 257/E51.026 |
| 2013/0263925 A1 | 10/2013 | Gaudiana et al. | |
| 2013/0285007 A1* | 10/2013 | Wheeler ................ | H01L 29/02 423/325 |
| 2016/0075818 A1* | 3/2016 | Bumbu ............... | F16L 55/1645 442/87 |
| 2017/0077421 A1* | 3/2017 | Ihn ....................... | H01L 51/5012 |
| 2017/0084844 A1 | 3/2017 | Parham et al. | |
| 2017/0256364 A1 | 9/2017 | Yamamoto et al. | |
| 2019/0019956 A1* | 1/2019 | Gorohmaru ............ | C08L 65/02 |

FOREIGN PATENT DOCUMENTS

| | | | |
|---|---|---|---|
| CN | 105405974 | A | 3/2016 |
| CN | 106432265 | A | 2/2017 |
| EP | 0067691 | A1 | 12/1981 |
| EP | 1344788 | A1 | 9/2003 |
| JP | 2588395 | B2 * | 3/1997 |
| JP | 3868228 | * | 1/2007 |
| JP | 2009021104 | A | 1/2009 |
| JP | 2012003947 | A | 1/2012 |
| JP | 2012-527089 | A | 11/2012 |
| JP | 2014-26978 | A | 2/2014 |
| JP | 2015514327 | A | 5/2015 |
| KR | 20070093881 | * | 9/2007 |
| WO | 2011/087601 | A1 | 7/2011 |
| WO | 2013/052096 | A1 | 4/2013 |
| WO | 2016/034498 | A1 | 8/2015 |

OTHER PUBLICATIONS

Japanese Office Action for Japanese Application No. 2019-553476 dated Oct. 5, 2021 (6 pages).
European Search Report for European Application No. 17163956 dated Sep. 22, 2017 (2 pages).
European Examination Report for European Application No. 17163956 dated Sep. 16, 2020 (1 page).
European Examination Report for European Application No. 17163956 dated May 19, 2021 (5 pages).
European Search for European Application No. 17163956.0, cf Form 1507 (6 pages).
PCT International Search Report and Written Opinion for PCT Application No. PCT/EP2018/058154 dated Jun. 27, 2018 (13 pages).
Notification of the First Office Action issued in China application No. 201880022797.1, dated Oct. 11, 2021, 25 pages.
Notification of the Second Office Action issued in China application No. 201880022797.1, dated Sep. 2, 2022, 26 pages.
Communication pursuant to Article 94(3) EPC issued in European application No. 17163956.0, dated Jun. 10, 2022, 5 pages.
Notice of Reasons for Refusal issued in Japan application No. 2019-553476, dated Apr. 26, 2022, 12 pages.
Request for the Submission of an Opinion issued in Korea application No. 10-2019-7031745, dated Sep. 12, 2022, 13 pages.
Decision of Rejection issued in China application No. 201880022797.1, dated Mar. 9, 2023, 28 pages.

* cited by examiner

INK COMPOSITION FOR FORMING AN ORGANIC LAYER OF A SEMICONDUCTOR

CROSS REFERENCE TO RELATED APPLICATIONS

This application is a U.S. national stage application of PCT/EP2018/058154, filed Mar. 29, 2018, which claims priority to European Application No. 17163956.0, filed Mar. 30, 2017. The content of these applications is incorporated herein by reference.

TECHNICAL FIELD

The present invention relates to an ink composition for forming an organic layer of a semiconductor, an electronic device, such as an OLED or solar cell, comprising the semiconductor layer, as well as a method of manufacturing the organic semiconductor layer.

BACKGROUND ART

Optoelectronic devices have been succeeded in commercialization and have been studied intensively for their scale up and cost-efficient fabrication. Typical examples of such optoelectronic device include organic electroluminescent devices or organic light emitting diodes (OLEDs), which are light emitting devices using a spontaneous light emitting phenomenon caused by coupling between electrons and holes upon the application of electric current to a device including a fluorescence- or phosphorescence-based light emitting layer between an anode and a cathode. Such OLEDs have a simple structure, are obtained by a simple process, and realize high image quality and a broad view angle. Further, they completely realize video images and high color purity, are driven with low power consumption under a low voltage, and thus are suitable for portable electronic appliances.

WO 2016/034498 A1 refers to a method for reducing a parasitic resistance at an interface between a conducting electrode region and an organic semiconductor in a thin film transistor, the method comprising: providing a solution comprising a dopant for doping said semiconductor, and depositing said solution onto said semiconductor and/or said conducting electrode region to selectively dope said semiconductor adjacent said interface between said conducting electrode region and said semiconductor, wherein depositing said solution comprises inkjet-printing said solution.

EP 0 067 691 A1 refers to a 1,2,3,4,5,6,7,8-octahydro-11,11,12,12-tetracyano-9,10-anthraquinodimethane compounds of the general formula:

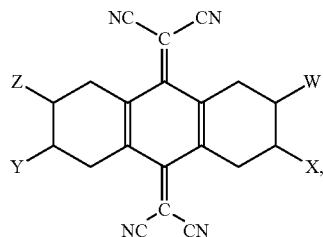

in which W, X, Y and Z independently represent hydrogen, halogen, hydroxyl group, hydrocarbon group having 1 to 8 carbon atoms, alkoxy group or acyloxy group provided that W=Y and X=Z, or W=Z and X=Y. The compositions and charge transfer complexes comprising these compounds are also described together with intermediates for the compounds.

US 2013/263925 A1 refers to a photovoltaic cell that comprises a first electrode, a second electrode, a photoactive layer between the first electrode and the second electrode, and a hole carrier layer between the first electrode and the photoactive layer. In one embodiment, the hole carrier layer comprises an oxidizing agent and a hole carrier polymer.

WO 2013/052096 A1 refers to a method including combining at least one first compound in a neutral form with at least one ionic dopant in a first solvent system to provide a first doped reaction product, isolating the first doped reaction product in solid form, and combining the isolated first doped reaction product with at least one conjugated polymer in neutral form in a second solvent system to form a second doped reaction product including an oxidized form of the conjugated polymer a neutral form of the first compound. Advantages include better stability, ease of use, and lower metal content. Applications include organic electronic devices including OLEDs.

WO 2011/087601 A1 refers to a liquid composition (e.g., inkjet fluid) for forming an organic layer of an organic electronic device (e.g., an OLED). The liquid composition comprises a small molecule organic semiconductor material mixed in an aromatic solvent. The aromatic solvent, when left as a residue in the organic layer, is capable of presenting relatively reduced resistivity to charge transport or facilitating charge transport in the organic layer that is deposited, as compared to other conventional solvents.

A typical OLED includes an anode, a hole injection layer, a hole transport layer, an emitting layer, an electron transport layer, an electron injection layer and a cathode, stacked successively on a substrate. Herein, the anode is frequently made of indium tin oxide (ITO) having a low surface resistance and high transmittance. In addition, multiple organic thin films are disposed between the two electrodes as described above to increase the light emitting efficiency and lifespan.

Many expensive vacuum chambers are required to form such a multilayered OLED with high efficiency and a patterning mask is also required. Moreover, processes for fabricating OLEDs have fundamental limitation in terms of low-temperature operation. For these reasons, it gets increasingly difficult to scale up OLEDs in their size and to improve cost efficiency.

Therefore, there has been a continuous need for developing a novel process to solve the above-mentioned problems.

Many attempts have been made to overcome the above-mentioned problems through the use of a printing process. For example, an inkjet printing process substituting for a known deposition process is differentiated from the deposition process in that it consumes a low amount of materials, shows high efficiency, and allows scale-up and low-temperature operation. Therefore, flexible substrates, such as plastics, may be used in an inkjet printing process, resulting in significant improvement of cost-efficiency. As a result, many Korean and foreign companies and organizations have conducted active research and development of such inkjet printing processes. It is expected that inkjet printing technology is applied to various industrial fields, including electric/electronic, energy, display, bioindustries, etc., and contributes to production of a wide variety of commercial products and improvement in cost-efficiency and ecofriendly characteristics.

Inkjet printing is low-noise, low-cost and non-contact printing technology. Depending on ink dispense modes, inkjet printing processes are classified into continuous jet processes and drop-on-demand (DOD) processes. The continuous jet processes perform printing by controlling ink direction through a change in electromagnetic field while ink is dispensed continuously with a pump. The DOD processes dispense ink only at a desired moment through electrical signals, and are further classified into piezoelectric inkjet processes generating pressure with a piezoelectric plate that causes dynamic deformation by electricity, and thermal inkjet processes using pressure generated upon the expansion of bubbles produced by heat.

The known ink compositions are problematic in that they cause non-uniformity of droplet sizes and degradation of opto-electrical properties as compared to other conventional processes. This may result from the fact that the known processes may not provide an ink composition for inkjet printing that is chemically stable and shows no phase separation during storage, has controllable viscosity, surface tension, solubility, film uniformity after drying, etc., which renders the composition not suitable for inkjet processes.

It is required for an ink composition for applying key materials, such as organic materials for the manufacture of a layer such as of a light emission, electron transport, electron injection, hole injection or hole transport, of opto-electronic device, including OLEDs or solar cells, to inkjet printing processes, to have optimized chemical stability of the components of the ink composition as well as phase stability, viscosity, surface tension, solubility, film uniformity after drying, etc. Those properties may affect reproducibility, droplet forming systems, droplet sizes and velocities under a constant pressure.

Conventional inkjet processes using various additives result in degradation of dielectric coefficient, charge transfer and conductivity due to degradation of components of the ink composition as well as due to phase separation. In particular impurities and concentration variation in the ink composition remaining after the fabrication are responsible for the decrease of dielectric coefficient, charge transfer, life span and conductivity for the electronic device, such as OLED, organic thin film transistor (OTFT) or solar cell.

Further, the liquid processed deposition of layers which constitute an organic electronic device requires the preparation of inks which comprise materials needed for the operation of the organic electronic device—for instance charge carrier transport material (host) and dopants—as well as solvents and optional materials such as additives. These components have to be married into a stable, processable ink that enables for example liquid-processed or printed hole-injection layers under typical manufacturing conditions in the production of organic electronic devices.

On the one hand, the solvent or solvents comprised in the ink must have sufficient dissolution power to obtain the desired concentration of the different components contained in the ink.

On the other hand, the components must be stable in the ink in order not to change the properties during ink preparation and processing. In addition, physical parameters of the ink must allow processing under typical manufacturing conditions in production like ambient temperature.

It is an object of the present invention to provide an ink composition for fabricating optoelectronic devices, which is storage stable over time, controlling viscosity, solubility and film uniformity so that the ink compositions are applicable to printing processes, such as inkjet processes and overcomes the above mentioned drawbacks related to the prior art.

DISCLOSURE

As a result, it is possible to provide semiconductor layer of electronic devices, to realize scale-up of semiconductor layers and devices comprising these layers, and to improve cost-efficiency and reproducibility of same quality.

In one general aspect, there is provided a printing ink composition directly applicable to a patterning process, obtained by forming materials for optoelectronic device into ink.

More particularly, there is provided a printing ink composition for printing semiconductor layer or layers of optoelectronic device, such as OLED, Solar Cells or OTFT.

An aspect of the present invention provides an ink composition for forming an organic semiconductor layer, wherein the ink composition comprises:

at least one p-type dopant comprising electron withdrawing groups;

at least one first auxiliary compound, wherein the first auxiliary compound is an aromatic nitrile compound, wherein the aromatic nitrile compound has about ≥1 to about ≤3 nitrile groups and a melting point of about <100° C., wherein the first auxiliary compound is different from the p-type dopant; and wherein the electron withdrawing groups are fluorine, chlorine, bromine and/or nitrile.

Further, ink compositions for forming active layers in an OLED are provided.

Also provided are methods of forming active layers of an OLED using the ink compositions.

The ink compositions are able to provide layers having highly uniform thicknesses and homogenous compositions.

As a result, OLEDs fabricated using the ink compositions are able to provide highly uniform light emission profiles.

Advantages

Surprisingly it was found, that nitrile solvents, in particular aromatic nitriles like benzonitrile, o-tolunitrile etc., are very suitable to dissolve the p-type dopant in sufficiently high concentrations and to provide an ink stability over a sufficiently long period of time.

It has been additional found by the inventors that nitrile solvents, in particular aromatic nitriles like benzonitrile, o-tolunitrile etc., are very suitable to dissolve the organic charge transport material in sufficiently high concentrations and to provide an ink stability over a sufficiently long period of time.

For example the aromatic nitrile solvents may be beneficially used as a single solvent for the ink composition according to the invention in solution processing and printing, which fulfils stability, processability, solubility and environmental requirements at the same time.

The use of the preferred nitrile solvents provides an ink composition wherein both the organic charge transport material and the p-dopant are stable for about ≥6 months at about 23° C., or preferably about ≥9 months at about 23° C.

The good stability of the organic charge transport material and the p-type dopant of the ink composition was unexpected, because significant changes were observed in the IR-spectrum or UV-vis Spectrum of the compounds, in particular of the p-type dopant, by comparison of IR-spectra/UV-vis-spectra of solid state versus in solution.

The ink solution can be suitably used for the manufacture of organic electronic layers, such as hole transport layers or injection layers in direct contact with an electrode or charge generation layers as part of a p-n-junction or conductive p-type interlayers by solution processing.

Solution processing methods include spin coating, slot die coating and inkjet printing but are not limited thereto.

The wide boiling point range covered by the ink composition gives flexibility for the solution process of the chosen layer. For example at temperatures of about <150° C. for spin coating, slot die coating, and at temperatures of about ≥150 to about ≤300° C. for industrial inkjet printing of OLED-layers.

Control the boiling point temperature allows to provide an ink composition that is adapted to the individual processing type for the layer manufacture.

In addition, the surface tension (SFT) of the ink is also adjustable, preferably between about ≥15 dyn/cm to about ≤50 dyn/cm, or about ≥20 to about ≤40 dyn/cm (mN/m), depending on type of aromatic nitrile compound and co-solvent. A proper match of the surface tension of the ink ($SFT_{ink}$) to the surface energy of the substrate ($SFT_{substrate}$) may achieve good wetting characteristics of the ink on the substrate. For good wetting characteristics it can be preferred that the surface tension of the ink composition follows $SFT_{ink} < SFT_{substrate}$.

DESCRIPTION IN DETAIL

An embodiment of the ink composition for forming an organic semiconductor layer comprises:
- at least one p-type dopant comprising electron withdrawing groups;
- at least one organic charge transport material, wherein the organic charge transport material is different from the p-type dopant;
- at least one first auxiliary compound, wherein the first auxiliary compound is an aromatic nitrile compound, wherein the aromatic nitrile compound has about ≥1 to about ≤3 nitrile groups and a melting point of about <100° C., wherein the first auxiliary compound is different from the p-type dopant; and
wherein the electron withdrawing groups are fluorine, chlorine, bromine and/or nitrile.

According to another embodiment the ink composition for forming an organic semiconductor layer comprises:
- at least one p-type dopant comprising electron withdrawing groups;
- at least one first auxiliary compound, wherein the first auxiliary compound is an aromatic nitrile compound, wherein the aromatic nitrile compound has about ≥1 to about ≤3 nitrile groups and a melting point of about <100° C., wherein the first auxiliary compound is different from the p-type dopant; and
wherein the electron withdrawing groups are fluorine, chlorine, bromine and/or nitrile; and
for 10 g solid of a p-type dopant of compound P11 [4,4',4''-((1E,1'E,1''E)-cyclopropane-1,2,3-triylidenetris(cyanomethanylylidene))tris(2,3,5,6-tetrafluorobenzonitrile)] (NDP-9, available from NovaLED)] dissolved per 1 ml benzonitrile, the ink composition may comprises in addition at least one second auxiliary compound, which is liquid at about 23° C., and wherein the at least one second auxiliary compound has a chemical structure that is different from the first auxiliary compound and is different from the p-type dopant.

According to another embodiment the ink composition for forming an organic semiconductor layer comprises:
- at least one p-type dopant comprising electron withdrawing groups;
- at least one first auxiliary compound, wherein the first auxiliary compound is an aromatic nitrile compound, wherein the aromatic nitrile compound has about ≥1 to about ≤3 nitrile groups and a melting point of about <100° C., wherein the first auxiliary compound is different from the p-type dopant; and
wherein the electron withdrawing groups are fluorine, chlorine, bromine and/or nitrile; and
for a p-type dopant of compound P11 [4,4',4''-((1E,1'E,1''E)-cyclopropane-1,2,3-triylidenetris(cyanomethanylylidene))tris(2,3,5,6-tetrafluorobenzonitrile)] (NDP-9, available from NovaLED)] dissolved in benzonitrile, the ink composition may comprises in addition at least one second auxiliary compound, which is liquid at about 23° C., and wherein the at least one second auxiliary compound has a chemical structure that is different from the first auxiliary compound and is different from the p-type dopant.

According to another embodiment the ink composition for forming an organic semiconductor layer comprises:
- at least one p-type dopant comprising electron withdrawing groups;
- at least one first auxiliary compound, wherein the first auxiliary compound is an aromatic nitrile compound, wherein the aromatic nitrile compound has about ≥1 to about ≤3 nitrile groups and a melting point of about <100° C., wherein the first auxiliary compound is different from the p-type dopant; and
wherein the electron withdrawing groups are fluorine, chlorine, bromine and/or nitrile;
wherein the ink composition comprises in addition at least one second auxiliary compound, which is liquid at about 23° C., and wherein the at least one second auxiliary compound has a chemical structure that is different from the first auxiliary compound and is different from the p-type dopant.

According to another embodiment of the ink composition for forming an organic semiconductor layer, wherein the second auxiliary compound is free of a nitrile group.

According to another embodiment of the ink composition for forming an organic semiconductor layer, wherein the second auxiliary compound is free of an electron withdrawing group.

According to another embodiment of the ink composition for forming an organic semiconductor layer, wherein the second auxiliary compound is free of a nitrile group and/or is free of an electron withdrawing group.

According to another embodiment the ink composition for forming an organic semiconductor layer comprises:
- at least one p-type dopant comprising electron withdrawing groups;
- at least one first auxiliary compound, wherein the first auxiliary compound is an aromatic nitrile compound, wherein the aromatic nitrile compound has about ≥1 to about ≤3 nitrile groups and a melting point of about <100° C., wherein the first auxiliary compound is different from the p-type dopant; and
wherein the electron withdrawing groups are fluorine, chlorine, bromine and/or nitrile;
wherein the ink composition comprises in addition at least one second auxiliary compound, which is liquid at about 23° C., and wherein the at least one second auxiliary compound has a chemical structure that is different from the first auxiliary compound and is different from the p-type dopant; and wherein the second auxiliary compound has a boiling point at atmospheric pressure which is ≥50° C., preferably the boiling point of the second auxiliary compound is between ≥50° C. and ≤350° C., more preferably between ≥100° C. and ≤350° C., more preferred between ≥150° C. and ≤350° C.

According to another embodiment the ink composition for forming an organic semiconductor layer comprises:
- at least one p-type dopant comprising electron withdrawing groups, and which is solid at about ≥100° C.;
- at least one organic charge transport material, which is solid at about ≥100° C., and wherein the organic charge transport material is different from the p-type dopant;
- at least one first auxiliary compound, wherein the first auxiliary compound is an aromatic nitrile compound, wherein the aromatic nitrile compound has about ≥1 to about ≤3 nitrile groups and a melting point of about <100° C., wherein the first auxiliary compound is different from the p-type dopant; and wherein the electron withdrawing groups are fluorine, chlorine, bromine and/or nitrile.

According to another embodiment the ink composition for forming an organic semiconductor layer comprises:
i) —at least one p-type dopant comprising electron withdrawing groups;
  at least one first auxiliary compound, wherein the first auxiliary compound is an aromatic nitrile compound, wherein the aromatic nitrile compound has about ≥1 to about ≤3 nitrile groups and a melting point of about <100° C., wherein the first auxiliary compound is different from the p-type dopant; and
  wherein the electron withdrawing groups are fluorine, chlorine, bromine and/or nitrile;
  wherein the ink composition comprises in addition at least one second auxiliary compound, which is liquid at about 23° C., and wherein the at least one second auxiliary compound has a chemical structure that is different from the first auxiliary compound and is different from the p-type dopant, preferably the second auxiliary compound is free of a nitrile group and/or is free of an electron withdrawing group; or
ii) —at least one p-type dopant comprising electron withdrawing groups, and which is solid at about ≥100° C.;
  at least one organic charge transport material, which is solid at about ≥100° C., and wherein the organic charge transport material is different from the p-type dopant;
  at least one first auxiliary compound, wherein the first auxiliary compound is an aromatic nitrile compound, wherein the aromatic nitrile compound has about ≥1 to about ≤3 nitrile groups and a melting point of about <100° C., wherein the first auxiliary compound is different from the p-type dopant; and
  wherein the electron withdrawing groups are fluorine, chlorine, bromine and/or nitrile.

According to another embodiment the ink composition for forming an organic semiconductor layer comprises:
- at least one p-type dopant comprising electron withdrawing groups, and which is solid at about ≥100° C.;
- at least one organic charge transport material, which is solid at about ≥100° C., and wherein the organic charge transport material is different from the p-type dopant;
- at least one first auxiliary compound, wherein the first auxiliary compound is an aromatic nitrile compound, wherein the aromatic nitrile compound has about ≥1 to about ≤3 nitrile groups and a melting point of about <100° C., wherein the first auxiliary compound is different from the p-type dopant; and wherein the electron withdrawing groups are fluorine, chlorine, bromine and/or nitrile.

According to another embodiment the ink composition for forming an organic semiconductor layer comprises:
- at least one p-type dopant, wherein the amount of electron withdrawing groups in the sum formula of the at least one p-type dopant is about ≥17 atomic percent to about ≤90 atomic percent;
- at least one organic charge transport material, wherein the amount of electron withdrawing groups in the sum formula of the at least one organic charge transport material is ≥0 to about <17 atomic percent, and wherein the organic charge transport material is different from the p-type dopant;
- at least one first auxiliary compound, wherein the first auxiliary compound is an aromatic nitrile compound, wherein the aromatic nitrile compound has about ≥1 to about ≤3 nitrile groups and a melting point of about <100° C., wherein the first auxiliary compound is different from the p-type dopant; and wherein the electron withdrawing groups are fluorine, chlorine, bromine and/or nitrile.

According to another embodiment the ink composition for forming an organic semiconductor layer comprises:
- at least one p-type dopant, comprises at least about ≥3 electron withdrawing groups;
- at least one organic charge transport material comprises at least about 0 to about <3 electron withdrawing groups, and wherein the organic charge transport material is different from the p-type dopant;
- at least one first auxiliary compound, wherein the first auxiliary compound is an aromatic nitrile compound, wherein the aromatic nitrile compound has about ≥1 to about ≤3 nitrile groups and a melting point of about <100° C., wherein the first auxiliary compound is different from the p-type dopant; and wherein the electron withdrawing groups are fluorine, chlorine, bromine and/or nitrile.

Another embodiment of the ink composition for forming an organic semiconductor layer comprises:
- at least one p-type dopant, having about ≥4 atoms and wherein the amount of electron withdrawing groups in the sum formula of the at least one p-type dopant is about ≥17 atomic percent to about ≤90 atomic percent;
- at least one organic charge transport material, having about ≥4 atoms and wherein the amount of electron withdrawing groups in the sum formula of the at least one organic charge transport material is ≥0 to about <17 atomic percent, wherein the organic charge transport material is different from the p-type dopant and the first auxiliary compound;
- at least one first auxiliary compound, wherein the first auxiliary compound is an aromatic nitrile compound, wherein the aromatic nitrile compound has about ≥1 to about ≤3 nitrile groups and a melting point of about <100° C., wherein the first auxiliary compound is different from the p-type dopant and the organic charge transport material; and wherein the electron withdrawing groups are fluorine, chlorine, bromine and/or nitrile.

Another embodiment of the ink composition for forming an organic semiconductor layer comprises:
- at least one p-type dopant, having about ≥4 atoms and wherein the amount of electron withdrawing groups in the sum formula of the at least one p-type dopant is about ≥17 atomic percent to about ≤90 atomic percent;
- at least one organic charge transport material, having about ≥4 atoms and wherein the amount of electron withdrawing groups in the sum formula of the at least one organic charge transport material is ≥0 to about <17 atomic percent and having a melting point of about ≥100° C.;
- at least one first auxiliary compound, wherein the first auxiliary compound is an aromatic nitrile compound, wherein the aromatic nitrile compound has about ≥1 to about ≤3 nitrile groups and a melting point of about <100° C., wherein the first auxiliary compound is different from the p-type dopant; and wherein the electron withdrawing groups are fluorine, chlorine, bromine and/or nitrile.

Another embodiment of the ink composition for forming an organic semiconductor layer comprises:
- at least one p-type dopant, having about ≥4 atoms and wherein the amount of electron withdrawing groups in the sum formula of the at least one p-type dopant is about ≥22 atomic percent to about ≤90 atomic percent;
- at least one organic charge transport material, having about ≥6 atoms, preferably about ≥12 atoms, and wherein the amount of electron withdrawing groups in the sum formula of the at least one organic charge transport material is ≥0 to about <17 atomic percent and having a melting point of about ≥100° C.;
- at least one first auxiliary compound, wherein the first auxiliary compound is an aromatic nitrile compound, wherein the aromatic nitrile compound has about ≥1 to about ≤3 nitrile groups and a melting point of about <100° C., wherein the first auxiliary compound is different from the p-type dopant; and wherein the electron withdrawing groups are fluorine, chlorine, bromine and/or nitrile.

Another embodiment of the ink composition for forming an organic semiconductor layer comprises:
- at least one p-type dopant, having about ≥4 atoms and wherein p-type dopant comprises at least about ≥3 electron withdrawing groups and about ≤100 electron withdrawing groups;
- at least one organic charge transport material, having about ≥4 atoms and wherein the organic charge transport material has ≥0 to <3 electron withdrawing groups and a melting point of about ≥100° C.;
- at least one first auxiliary compound, wherein the first auxiliary compound is an aromatic nitrile compound, wherein the aromatic nitrile compound has about ≥1 to about ≤3 nitrile groups and a melting point of about <100° C., wherein the first auxiliary compound is different from the p-type dopant; and wherein the electron withdrawing groups are fluorine, chlorine, bromine and/or nitrile.

Another embodiment of the ink composition for forming an organic semiconductor layer comprises:
- at least one p-type dopant, having about ≥4 atoms and wherein the amount of electron withdrawing groups in the sum formula of the at least one p-type dopant is about ≥22 atomic percent to about ≤90 atomic percent;
- at least one organic charge transport material, having about ≥6 atoms, preferably about ≥12 atoms, and wherein the amount of electron withdrawing groups in the sum formula of the at least one organic charge transport material is ≥0 to about <17 atomic percent and having a melting point of about ≥100° C.;
- at least one first auxiliary compound, wherein the first auxiliary compound is an aromatic nitrile compound, wherein the aromatic nitrile compound has about ≥1 to about ≤2 nitrile groups and a melting point of about <100° C., wherein the first auxiliary compound is different from the p-type dopant; and wherein the electron withdrawing groups are fluorine, chlorine, bromine and/or nitrile.

Another embodiment of the ink composition for forming an organic semiconductor layer comprises:
- at least one p-type dopant, having about ≥4 atoms and wherein p-type dopant comprises at least about ≥3 electron withdrawing groups and about ≤100 electron withdrawing groups;
- at least one organic charge transport material, having about ≥4 atoms and wherein the organic charge transport material has ≥0 to <3 electron withdrawing groups and a melting point of about ≥100° C.;
- at least one first auxiliary compound, wherein the first auxiliary compound is an aromatic nitrile compound, wherein the aromatic nitrile compound has about ≥1 to about ≤2 nitrile groups and a melting point of about <100° C., wherein the first auxiliary compound is different from the p-type dopant; and wherein the electron withdrawing groups are fluorine, chlorine, bromine and/or nitrile.

Definitions

Aromatic refers to a molecule or a moiety as part of a molecule which contains at least one aromatic ring or aromatic ring system. Aromatic ring or aromatic ring system refers to a planar ring or ring system of covalently bound carbon or hetero-atoms atoms, wherein the planar ring or ring system comprises a conjugated system of delocalized electrons fulfilling Hückel's rule. Examples of aromatic moieties as part of a molecule include monocyclic groups like phenyl or tolyl, polycyclic groups which comprise more aromatic rings linked by single bonds, like biphenylyl, and polycyclic groups comprising fused rings, like naphtyl or fluoren-2-yl, carbazolyl.

The term "hetero atom" is understood the way that at least one carbon atom, in a structure which may be formed by covalently bound carbon atoms, is replaced by another polyvalent atom. Preferably the hetero atoms may be selected from B, Si, N, P, O, S; and more preferably selected from N, P, O or S.

In the context of the present invention, "different" means that the compounds do not have an identical chemical structure.

The term "free of", "does not contain", "does not comprise" does not exclude impurities which may be present in the compounds prior to deposition. Impurities have no technical effect with respect to the object achieved by the present invention.

In the present specification the wording "life span" and "life time" are synonymously used.

If not otherwise stated the Relative humidity (abbreviated RH) is 40% and the temperature is 23° C.

In the specification, hole characteristics refer to an ability to donate an electron to form a hole when an electric field is applied and that a hole formed in the anode may be easily injected into the emission layer and transported in the emission layer due to conductive characteristics according to a highest occupied molecular orbital (HOMO) level.

In addition, electron characteristics refer to an ability to accept an electron when an electric field is applied and that electron formed in the cathode may be easily injected into the emission layer and transported in the emission layer due to conductive characteristics according to a lowest unoccupied molecular orbital (LUMO) level.

In the specification the amount of electron withdrawing groups in the sum formula of a molecule is given in atomic percent (at %) of electron withdrawing groups of the total number of atoms in the sum formula.

For clarity of definition and calculation, the sum formula is simplified in a way that one electron withdrawing group is counted as one atomic unit even if it consists of more than one atom.

According to the invention an electron withdrawing group is defined to be selected from the group of fluorine, chlorine, bromine and/or nitrile only.

The atomic percent of electron withdrawing groups is the percentage of electron withdrawing groups with respect to the total number of atoms and electron withdrawing groups in the sum formula of the compound/p-type dopant.

The total number of atoms and electron withdrawing groups in the p-type dopant is equal to or higher than 4.

The CN-group is counted as one electron withdrawing group in the (simplified) sum formula of the p-type dopant.

The amount of electron withdrawing groups calculated for a charge transport material is shown in Table 1.

TABLE 1

| Compound Name | Simplified sum formula (electron withdrawing groups in brackets) | Total number of atoms and electron withdrawing groups in the simplified sum formula [A] | Number of electron withdrawing groups in the simplified sum formula [B] | Atomic % of electron withdrawing groups in p-type dopant (at % EWG = [B] * 100%/[A] |
|---|---|---|---|---|
| N4,N4''-bis(3,5-bis(trifluoromethyl) phenyl)-N4,N4''-di(naphthalen-2-yl)-[1,1':4',1''-terphenyl]-4,4''-diamine (example for organic charge transport material) | C54H32N2(F)12 | 100 | 12 | 100% × 12/100 = 12% |

The amount of electron withdrawing groups calculated for a P-type dopants are shown in Table 2.

TABLE 2

| P-type Dopant | Simplified sum formula (electron withdrawing groups in brackets) | Total number of atoms and electron withdrawing groups in the simplified sum formula [A] | Number of electron withdrawing groups in the simplified sum formula [B] | Atomic % of electron withdrawing groups in p-type dopant (at % EWG = [B] * 100%/[A] |
|---|---|---|---|---|
| P1 | C12N6(CN)6 | 24 | 6 | 25.00 |
| P2 | C8(F)4(CN)4 | 16 | 8 | 50.00 |
| P3 | C6N2(F)4(CN)2 | 14 | 6 | 42.86 |
| P4 | C6N2(Cl)2(CN)2 | 12 | 4 | 33.33 |
| P5 | C6N2(F)2(Cl)2(CN)2 | 14 | 6 | 42.86 |
| P6 | C10N2(F)6(CN)2 | 20 | 8 | 40.00 |
| P7 | C10O2S4(CN)4 | 20 | 4 | 20.00 |
| P8 | C12(F)6(CN)4 | 22 | 10 | 45.45 |
| P9 | C8(F)2(Br)2(CN)4 | 16 | 8 | 50.00 |
| P10 | C20(F)10(CN)6 | 36 | 16 | 44.44 |
| P11 | C24(F)12(CN)6 | 42 | 18 | 42.86 |
| P12 | C27(F)15(Cl)6(CN)3 | 51 | 24 | 47.06 |
| P13 | C24(F)15(CN)3 | 42 | 18 | 42.86 |
| P14 | C42(F)27(CN)3 | 72 | 30 | 41.67 |
| P15 | C27(F)21(CN)3 | 51 | 24 | 47.06 |
| P16 | C21N3(F)12(CN)3 | 39 | 15 | 38.46 |
| P17 | C24(F)9(CN)6 | 39 | 15 | 38.46 |
| P18 | C30(F)27(CN)3 | 60 | 30 | 50.00 |
| P19 | C24H27CoN9P3(F)18 | 82 | 18 | 21.95 |
| P20 | C12MoS6(F)18 | 37 | 18 | 48.65 |
| P21 | C60(F)48 | 108 | 48 | 44.44 |
| P22 | C15N12(CN)6 | 33 | 6 | 18.18 |
| P23 | C24O4N2(F)16 | 46 | 16 | 34.78 |
| P24 | C14N6(F)12(CN)2 | 34 | 14 | 41.18 |
| P25 | C24BM(F)20 | 46 | 20 | 43.48 |

P-Type Dopant

P-type dopants may be used in hole injection layers (HIL). HILs may consist of the p-type dopant or may comprise the p-type dopant. HILs are commonly used in direct contact with an electrode, typically the anode, to reduce the barrier for hole injection from the electrode into the layers of the organic electronic device.

P-type dopants may be used in hole transport layers (HTL). The HTL may be composed of the p-type dopant and one or more organic charge transport materials. Thereby, the p-type dopants commonly increase the conductivity of the HTL and the conductivity of the HTL comprising the p-type dopant is higher than the conductivity achieved without the p-type dopant in the HTL.

P-type dopants may be used in layers inserted between two or more organic electronic devices with the aim to electrically connect the devices with low or negligible electrical loss. Such layers may be called charge generation layers. P-type charge generation layer may be composed of an organic material doped with the p-type dopant. The p-type charge generation layer can be arranged in direct contact with an n-type charge generation layer. There may also be an interlayer between the p-type charge generation layer and the n-type charge generation layer.

The charge generation layer is generally composed of at least two layers, which may be a p-type charge generation layer and an n-type charge generation layer.

Charge generation layers (CGL) for OLEDs are described in US 2012098012 A, and for organic photovoltaic cells in Chen et al Adv. Mater. 2014, 26, 5670-5677, incorporated herewith by reference.

According to an embodiment the ink composition comprises at least one p-type dopant, wherein the amount of electron withdrawing groups in the sum formula of the at least one p-type dopant is about ≥17 atomic percent or more.

According to an embodiment the ink composition comprises at least one p-type dopant, wherein the amount of electron withdrawing groups in the sum formula of the at least one p-type dopant is about ≥17 atomic percent and about ≤90 atomic percent.

According to an embodiment the ink composition comprises at least one p-type dopant, wherein the amount of electron withdrawing groups in the sum formula of the at least one p-type dopant is about ≥20 atomic percent and about ≤80 atomic percent.

According to an embodiment the ink composition comprises at least one p-type dopant, wherein the amount of electron withdrawing groups in the sum formula of the at least one p-type dopant is about ≥22 atomic percent and about ≤90 atomic percent, or about ≥22 atomic percent and about ≤80 atomic percent.

According to another embodiment the p-type dopant of the ink composition may comprise about ≥3 to about ≤100 electron withdrawing groups, preferably about ≥4 to about ≤70 electron withdrawing groups, and further preferred about ≥5 to about ≤50 electron withdrawing groups.

The electron withdrawing group of the p-type dopant can be independently selected from a group comprising carbonyl, nitro, fluorine, chlorine, bromine and/or nitrile.

The molecular mass of the p-type dopant can be in the range of about ≥60 g/mol to about ≤5000 g/mol, preferably about ≥100 g/mol to about ≤3000 g/mol, more preferred about ≥250 g/mol to about ≤2500 g/mol, in addition preferred about ≥350 g/mol to about ≤2000 g/mol.

P-type dopants used as guest compounds in mixtures with host compounds commonly increase the conductivity of this compound in comparison to the neat compound. This is provided as a result of electron transfer from HOMO of the host (hole transporting material) to the LUMO of the dopant. A suitable p-dopant, also named redox p-type dopant, is generally a molecule or radical with a LUMO level equal to HOMO of the host or below it. In some cases, the p-type dopant having LUMO level slightly above the HOMO level of the host are also applicable, but the difference of frontier orbital energies in these cases should not be higher than 0.5 eV, preferably not higher than 0.3 eV. The p-type dopant may be neutral or electrically charged.

The p-type dopant suitable for the ink composition may be selected from the group comprising:
hexaazatriphenylene substituted with at least four nitrile groups;
cyanobenzoquinone-dimethanes and/or cyanobenzoquinone-diimines, which are substituted with at least four electron withdrawing groups selected from the group comprising fluorine, chlorine, bromine and/or nitrile;
radialene compounds, preferably [3]-radialene compounds, which are substituted with at least four electron withdrawing groups selected from the group comprising fluorine, chlorine, bromine and/or nitrile;
tris(1-(pyridin-2-yl)-1H-pyrazol)cobalt(III) tris(hexafluorophosphate);
Molybdenum tris-[1,2-bis(trifluoromethyl)ethane-1,2-dithiolene];
$C_{60}F_{48}$;
charge neutral metal amide compounds, which are substituted with at least four electron withdrawing groups selected from the group comprising fluorine, chlorine, bromine and/or nitrile;
metal organic complex, preferably a group Vb/VIb/VIIb metal organic complex, wherein at least one ligand is substituted with at least four electron withdrawing groups selected from the group comprising fluorine, chlorine, bromine and/or nitrile.

According to another embodiment the p-type dopant of the ink composition may be preferably selected from the group comprising hexaazatriphenylene substituted with at least four nitrile groups.

According to another embodiment the p-type dopant of the ink composition may be preferably selected from the group comprising cyanobenzoquinone-dimethanes and/or cyanobenzoquinone-diimines, which are substituted with at least four electron withdrawing groups selected from the group comprising fluorine, chlorine, bromine and/or nitrile.

According to another embodiment the p-type dopant of the ink composition may be preferably selected from the group comprising radialene compounds, preferably [3]-radialene compounds, which are substituted with at least four electron withdrawing groups selected from the group comprising fluorine, chlorine, bromine and/or nitrile.

According to another embodiment the p-type dopant of the ink composition may be preferably selected from the group comprising tris(1-(pyridin-2-yl)-1H-pyrazol)cobalt(III) tris(hexafluorophosphate).

According to another embodiment the p-type dopant of the ink composition may be Molybdenum tris-[1,2-bis(trifluoromethyl)ethane-1,2-dithiolene].

According to another embodiment the p-type dopant of the ink composition may be a fluorinated fullerene, preferably $C_{60}F_{48}$.

According to another embodiment the p-type dopant of the ink composition may be preferably selected from the group comprising charge neutral metal amide compounds, which are substituted with at least four electron withdrawing groups selected from the group comprising fluorine, chlorine, bromine and/or nitrile.

According to another embodiment the p-type dopant of the ink composition may be preferably selected from the group comprising a metal organic complex, preferably a group Vb/VIb/VIIb metal organic complex, wherein at least one ligand is substituted with at least four electron withdrawing groups selected from the group comprising fluorine, chlorine, bromine and/or nitrile.

According to another embodiment the p-type dopant of the ink composition may be selected from the group of p-type dopants having the following chemical formula (P1) to (P25):

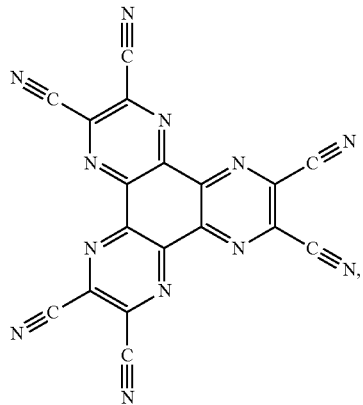
(P1)

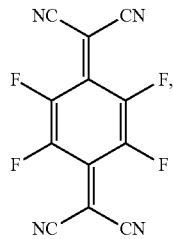
(P2)

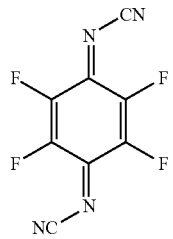
(P3)

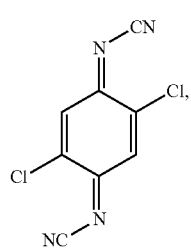
(P4)

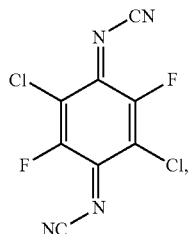
(P5)

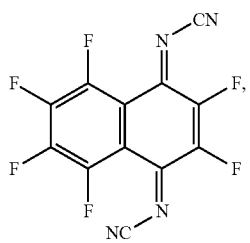
(P6)

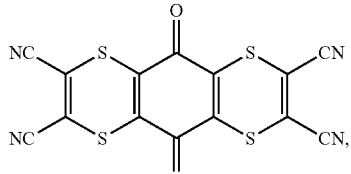
(P7)

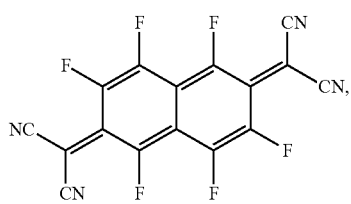
(P8)

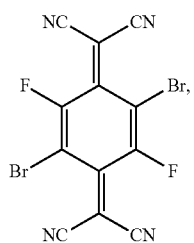
(P9)

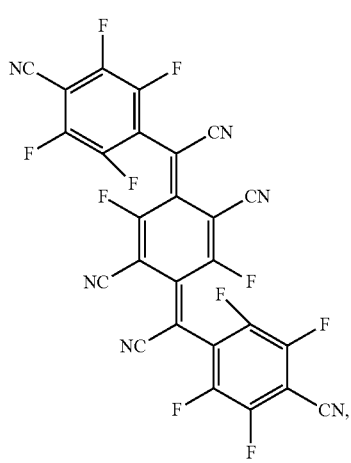
(P10)

(P11)
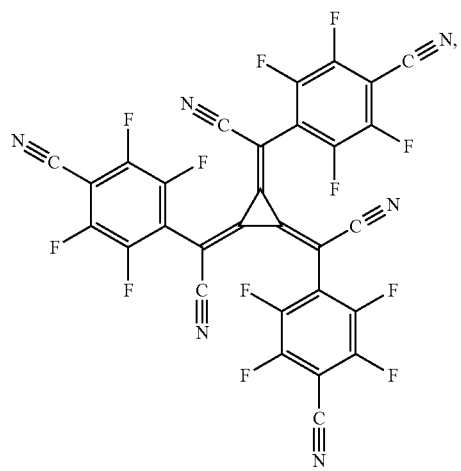
(P12)
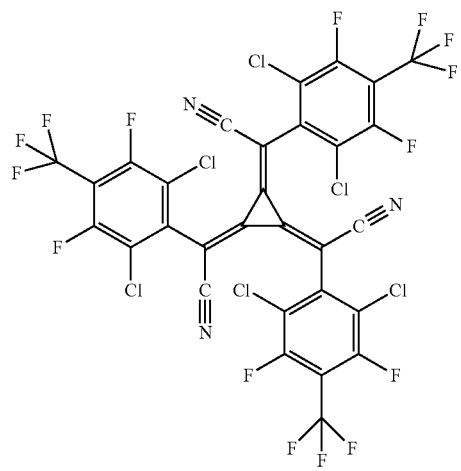
(P13)
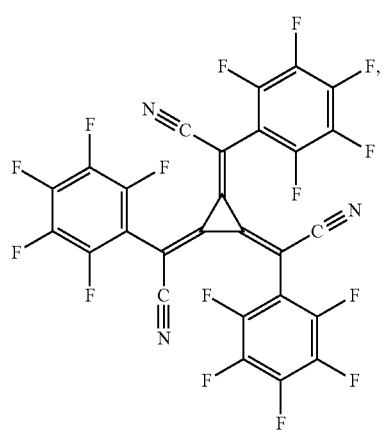
(P14)
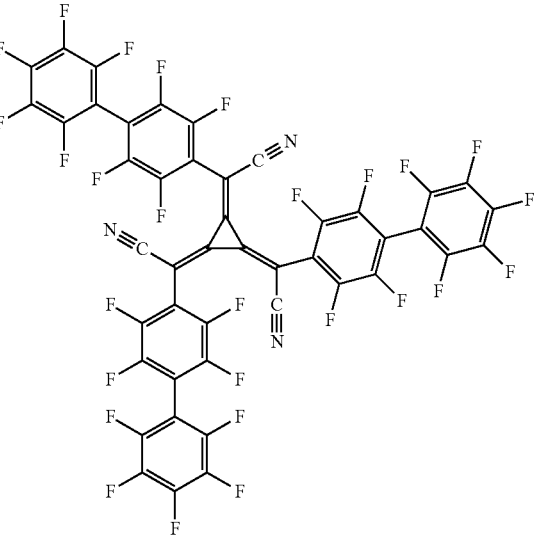
(P15)
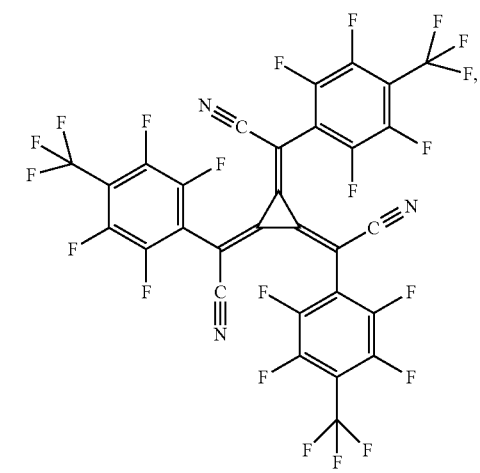
(P16)
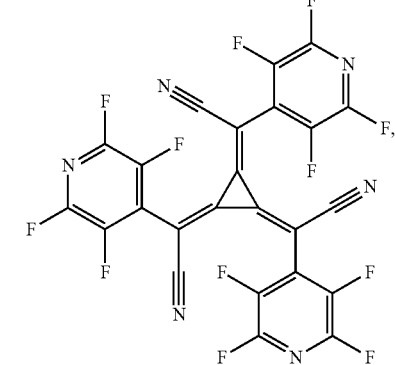

-continued

(17)
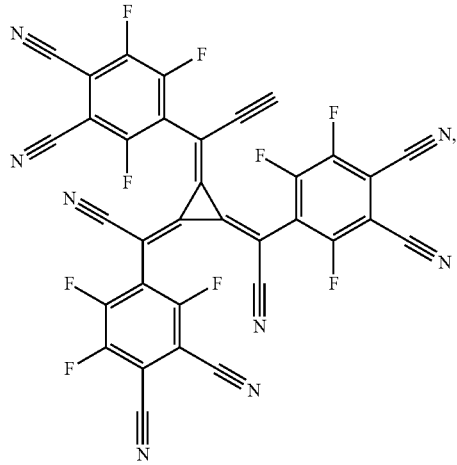

(P18)
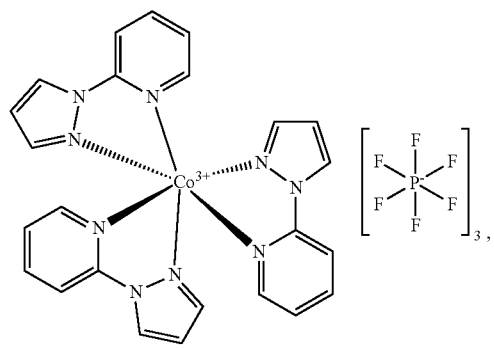

(P19)
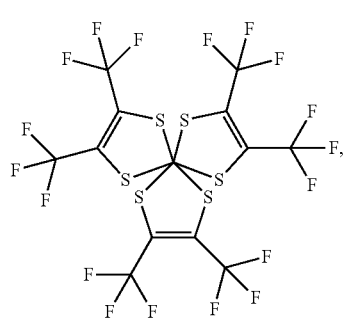

(P20)

-continued $C_{60}F_{48}$, (P21)

(P22)
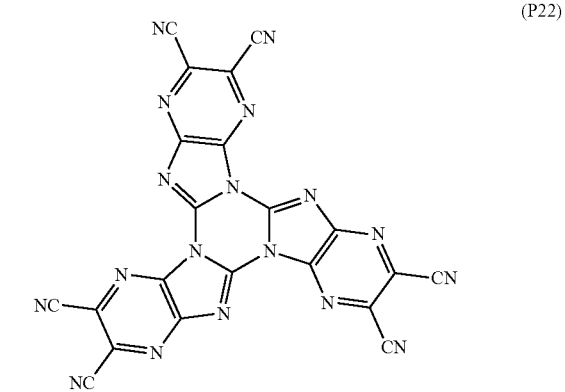

(P23)
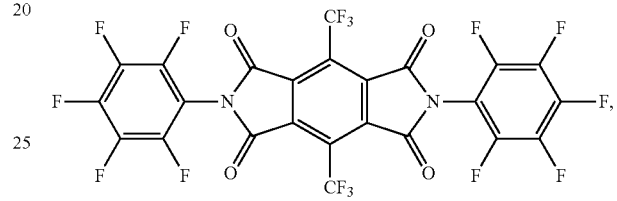

(P24)
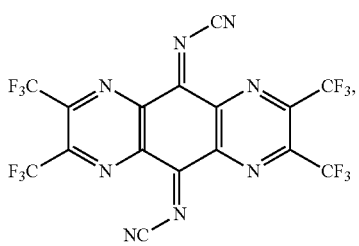

(P25)
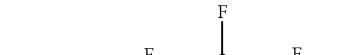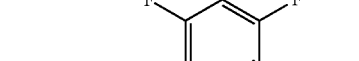

wherein M+ is a monovalent cation, preferably an alkali cation.

Organic Charge Transport Material

The organic charge transport materials (HTM) may be small molecules or polymers or mixtures thereof. Preferably, the organic charge transport material is a polymer or an oligomer. The polymer may be cross-linkable for instance in a way as described in WO2014037512.

Further cross-linkable polymer HTM that may be suitable are described in Carlos A. Zuniga, Stephen Barlow, and Seth R. Marder, "Approaches to Solution-Processed Multilayer Organic Light-Emitting Diodes Based on Cross-Linking", Chem. Mater. 2011, 23, 658-681, and incorporated by reference.

The organic hole-transport material may be any compound that is commonly used to form an HTL and can be processed as a component of the ink composition.

Compounds that may be suitably are disclosed for example in Yasuhiko Shirota and Hiroshi Kageyama, Chem. Rev. 2007, 107, 953-1010, and incorporated by reference.

According to an embodiment the ink composition comprises at least one organic charge transport material, wherein the amount of electron withdrawing groups in the sum formula of the at least one organic charge transport material is about ≥0 and <17 atomic percent and having a melting point of about ≥100° C.

An electron withdrawing group as defined according to the invention is fluorine, chlorine, bromine and/or nitrile.

According to an embodiment the ink composition comprises at least one organic charge transport material, wherein the amount of electron withdrawing groups in the sum formula of the at least one organic charge transport material is about ≥0 atomic percent and about <17 atomic percent and having a melting point of about ≥100° C. to ≤400° C. Polymer organic charge transport materials which are amorphous do not have a melting point.

According to another embodiment the electron withdrawing group of the at least one organic charge transport material of the ink composition is selected from fluorine, chlorine, bromine and/or nitrile; and preferably the electron withdrawing group is fluorine and/or nitrile.

According to another embodiment the ink composition may comprise at least two organic charge transport materials, of at least a first organic charge transport material and of at least a second organic charge transport material, wherein the molecular mass of the first organic charge transport material is lower than the molecular mass of the second organic charge transport material.

According to another embodiment the ink composition may comprise at least two organic charge transport materials, wherein the average molecular mass of the first organic charge transport material is in the range of about ≥300 g/mol to about ≤1500 g/mol, preferably about ≥400 g/mol to about ≤1300 g/mol; and/or the average molecular mass of the second organic charge transport material is in the range of ≥600 g/mol to about ≤2,000,000, preferably about ≥1000 g/mol to about ≤1,000,000 g/mol, more preferred about ≥1000 g/mol to about ≤500,000 g/mol;

wherein the molecular mass of the first organic charge transport material is lower than the molecular mass of the second organic charge transport material.

An organic charge transport material in the sense of this invention may be compounds containing in their molecular structure formula at least one of the following molecular fragments as mentioned in Table 3 below.

TABLE 3

Typical molecular fragments of organic charge transport materials

| Molecular Fragment | Fragment Name |
|---|---|
|  | Triarylamine |
|  | Carbazole |
|  | Benzo[5,6][1,4]oxa-thiino[2,3-b]phenoxathiine |
|  | Phenothiazine |
|  | Phosphanimine |
|  | Imidazolethione |
|  | Imidazolone |
|  | Phenylimidazolidine imine |

TABLE 3-continued

Typical molecular fragments of organic charge transport materials

| Molecular Fragment | Fragment Name |
| --- | --- |
| (pentacene structure) | Pentacene |
| (fluorene structure) | Fluorene |
| (thiophene structure) | Thiophene |

Specific examples for an organic charge transport material may comprise a spiro compound, a phthalocyanine compound, such as copper phthalocyanine (CuPc), a triphenyl amine compound like 4,4',4"-tris (3-methylphenylphenylamino) tri-phenylamine (m-MTDATA), TDATA, 2T-NATA, α-NPD (N,N'-Bis(naphthalen-1-yl)-N,N'-bis (phenyl)-benzidine), N4,N4,N4",N4"-tetra([1,1'-biphenyl]-4-yl)-[1,1':4',1"-terphenyl]-4,4"-diamine, a spiro-compound like 2,2',7,7'-tetrakis(N,N-di-p-methylphenylamino)-9,9'-spirobifluorene, a carbazole compound like tris(4-(9H-carbazol-9-yl)phenyl)amine.

Additional organic charge transport material also named "HTL-materials" that can be suitable used are pentacene, dinaphthothienothiophene (DNTT), further DNTT derivatives such as C10-DNTT (in general Cx-DNTT), Metal-Phthalocyanines (ZnPc,CuPc), perylenes such as Diindenoperylenes (DIP), Tetrapropyl-tetraphenyl-diindenoperylene (P4-PH4-DIP), poly(3-hexylthiophen-2,5-diyl) (P3HT), DIPs-pentacene, poly[2,5-bis(3-alkylthiophen-2-yl)thieno(3,2-b)thiophene] (PBTTT) or n-type materials like poly{[N,N9-bis(2-octyldodecyl)-naphthalene-1,4,5,8-bis(dicarboximide)-2,6-diyl]-alt-5,59-(2,29-bithiophene)} (P(NDI2OD-T2).

HTL materials that can be further suitable used and are commercially available are 1,3-Bis(N-carbazolyl)benzene, 4,4'-Bis(N-carbazolyl)-1,1'-biphenyl, 4,4'-Bis(N-carbazolyl)-1,1'-biphenyl, 1,4-Bis(diphenylamino)benzene, 4,4'-Bis(3-ethyl-N-carbazolyl)-1,1'-biphenyl, N,N'-Bis(3-methylphenyl)-N,N'-diphenylbenzidine,N,N'-Bis(phenanthren-9-yl)-N,N'-bis(phenyl)-benzidine, Copper(II) phthalocyanine, Copper(II) phthalocyanine,4,4'-Cyclohexylidenebis[N,N-bis(4-methylphenyl)benzenamine],4-(Dibenzylamino) benz-aldehyde-N,N-diphenylhydrazone, 9,9'-(2,2'-Dimethyl [1,1'-biphenyl]-4,4'-diyl)bis-9H-carbazole, 2,2'-Dimethyl-N,N'-di-[(1-naphthyl)-N,N'-diphenyl]-1,1'-biphenyl-4,4'-diamine, 9,9-Dimethyl-N,N'-di(1-naphthyl)-N,N'-diphenyl-9H-fluoren-2,7-diamine, N,N'-Di(1-naphthyl)-N,N'-diphenyl-(1,1'-biphenyl)-4,4'-diamine, N,N'-Di(1-naphthyl)-N,N'-diphenyl-(1,1'-biphenyl)-4,4'-diamine, N,N'-Di(2-naphthyl-N,N'-diphenyl)-1,1'-biphenyl-4,4'-diamine, 4-(Diphenylamino)benzaldehyde diphenylhydrazone, N,N'-Diphenyl-N,N'-di-p-tolylbenzene-1,4-diamine, Dipyrazino[2,3-f:2',3'-h]quinoxaline-2,3,6,7,10,11-hexacarbonitrile, Indium(III) phthalocyanine chloride, Poly(copper phthalocyanine), Poly(N-ethyl-2-vinylcarbazole), Poly (2-vinylcarbazole), Poly(9-vinylcarbazole), Poly(l-vinylnaphthalene), Poly(2-vinylnaphthalene), poly(triaryl amine), Spiro-MeOTAD, N,N,N',N'-Tetrakis(4-methoxyphenyl)benzidine, N,N,N',N'-Tetrakis(3-methylphenyl)-3,3'-dimethylbenzidine, N,N,N',N'-Tetrakis(2-naphthyl)benzidine, Tetra-N-phenylbenzidine, N,N,N',N'-Tetraphenylnaphthalene-2,6-diamine, Tin(IV) 2,3-naphthalocyanine dichloride, Titanyl phthalocyanine, Titanyl phthalocyanine, Tris(4-carbazoyl-9-ylphenyl)amine, Tris[4-(diethylamino) phenyl] amine, 1,3,5-Tris(diphenylamino)benzene, 1,3,5-Tris(2-(9-ethylcabazyl-3)ethylene)benzene, 1,3,5-Tris[(3-methylphenyl)phenylamino] benzene, 4,4',4"-Tris[2-naphthyl(phenyl)amino] triphenylamine, 4,4',4"-Tris[phenyl(m-tolyl)amino]triphenylamine, Tri-polyamine, Tungsten oxide, and/or Vanadyl phthalocyanine.

Further examples of compounds that may be used as HTL-materials are:

carbazole compounds, such as N-phenylcarbazole or polyvinylcarbazole;

amine compounds having an aromatic condensation ring, such as N,N'-bis(3-methylphenyl)-N,N'-diphenyl-[1,1-biphenyl]-4,4'-diamine (TPD), or N,N'-di(naphthalen-1-yl)-N,N'-diphenyl benzydine (alpha-NPD);

triphenylamine compounds, such as 4,4',4"-tris(N-carbazolyl)triphenylamine (TCTA) or N4,N4"-bis(3,5-bis (trifluoromethyl)phenyl)-N4,N4"-di(naphthalen-2-yl)-[1,1':4',1"-terphenyl]-4,4"-diamine, or thiophene-based compounds, such as poly(3-hexylthiophene)-2,5-diyl.

Organic charge transport materials that may be used are Polymer-1, preferably (Poly[(9,9-di(2-ethylhex-1-yl)-9H-fluoren-2,7-diyl)-co-(4-4'-4"-(4-azidobutox-1-yl)-N,N-diphenylaniline)]) and Polymer-2, preferably (Poly[(9,9-di(2-ethylhex-1-yl)-9H-fluoren-2,7-diyl)-co-(4-4'-4"-(prop-2-yn-1-yloxy)-N,N-diphenylaniline)]), which may be cross-linked:

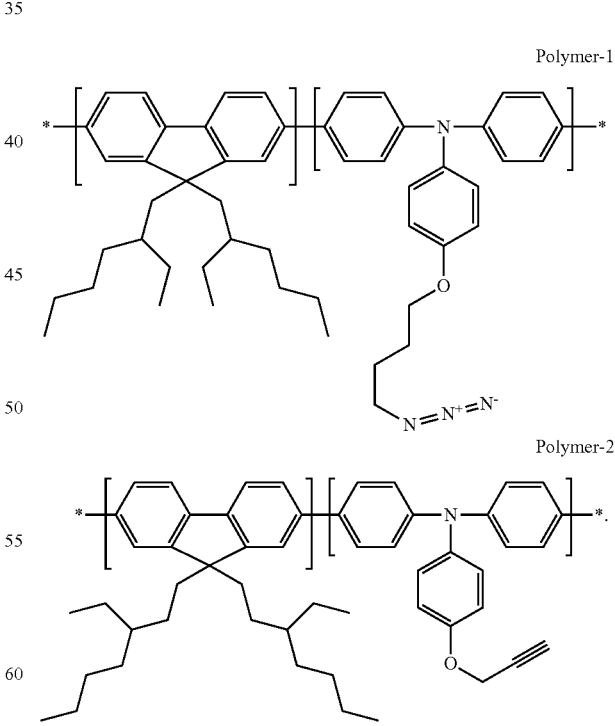

First Auxiliary Compound

The ink composition comprises at least one first auxiliary compound, wherein the first auxiliary compound is an aromatic nitrile compound, wherein the aromatic nitrile compound has about ≥1 to about ≤3 nitrile groups or has about ≥1 to about ≤2 nitrile groups, preferably 1 nitrile group, and a melting point of about <100° C., wherein the first auxiliary compound is different from the p-type dopant.

According to one embodiment the at least one first auxiliary compound may be selected from the group comprising substituted or unsubstituted benzonitrile. Substituted benzonitriles are preferably alkylbenzonitriles such as methylbenzonitrile, ortho-tolunitrile, and/or 4-butyl-benzonitrile.

According to another embodiment the at least one first auxiliary compound may be selected from the group comprising substituted or unsubstituted benzonitrile compounds, wherein the substituents may be selected from alkyl, hetero or non-hetero cycloalkyl, hetero or non-hetero aryl, and/or halogen.

The first auxiliary compound may be selected from 3-Acetylbenzonitrile, 4-Acetylbenzonitrile, Benzonitrile, Benzoylacetonitrile, 4-Butylbenzonitrile, 4-tert-Butylbenzonitrile, 4-Cyanophenylacetonitrile, 2,3-Dimethoxybenzonitrile, 3,4-Dimethoxybenzonitrile, 2-Ethylbenzonitrile, 3-Ethylbenzonitrile, 4-Ethylbenzonitrile 2-Methoxybenzonitrile, 3-Methoxybenzonitrile, 4-Methoxybenzonitrile, 4-Methoxybenzoylacetonitrile, 4-(Methoxymethyl)benzonitrile, Phenylacetonitrile, 2-Phenylbutyronitrile, 3-Phenylpropionitrile, 2-Propylenebenzonitrile, 4-Propylbenzonitrile o-Tolunitrile, m-Tolunitrile, p-Tolunitrile, 4-Toluoylacetonitrile, 3,4,5-Trimethoxybenzonitrile, 4-Cyanophenylacetonitrile, 2-chlorobenzonitrile, 3-chlorobenzonitrile, 4-chlorobenzonitrile.

The wording "alkyl group" refers to a saturated aliphatic hydrocarbyl group. The alkyl group may be a $C_1$ to $C_{10}$ alkyl group. More specifically, the alkyl group may be a $C_1$ to $C_{10}$ alkyl group or a $C_1$ to $C_6$ alkyl group. For example, a $C_1$ to $C_4$ alkyl group includes 1 to 4 carbons in alkyl chain, and may be selected from methyl, ethyl, propyl, iso-propyl, n-butyl, iso-butyl, sec-butyl, and t-butyl. Specific examples of the alkyl group may be a methyl group, an ethyl group, a propyl group, an isopropyl group, a butyl group, an isobutyl group, a t-butyl group, a pentyl group, a hexyl group.

The wording "aryl group" refers to a hydrocarbyl group which can be created by formal abstraction of one hydrogen atom from an aromatic ring in the corresponding aromatic hydrocarbon. Aromatic hydrocarbon refers to a hydrocarbon which contains at least one aromatic ring or aromatic ring system. Aromatic ring or aromatic ring system refers to a planar ring or ring system of covalently bound carbon atoms, wherein the planar ring or ring system comprises a conjugated system of delocalized electrons fulfilling Hückel's rule. Examples of aryl groups include monocyclic groups like phenyl or tolyl, polycyclic groups which comprise more aromatic rings linked by single bonds, like biphenylyl, and polycyclic groups comprising fused rings, like naphtyl or fluoren-2-yl.

Analogously, under heteroaryl, it is understood a group derived by formal abstraction of one ring hydrogen from a heterocyclic aromatic ring in a compound comprising at least one such ring.

Under hetero or non-hetero cycloalkyl, it is understood a group derived by formal abstraction of one ring hydrogen from a hetero or non-hetero cyclic ring having from 3 to 12 ring atoms.

The term "hetero" is understood the way that at least one carbon atom, in a structure which may be formed by covalently bound carbon atoms, is replaced by another polyvalent atom. Preferably, the hetero atoms are selected from B, Si, N, P, O, S; more preferably from N, P, O, S.

The term "Halogen" stand for halogens selected from the group comprising F, Cl, Br and I, wherein F and Cl are more preferred.

In may be preferred that the molecular mass of the at least one first auxiliary compound can be in the range of about ≥100 g/mol to about ≤500 g/mol, preferably about ≥100 g/mol to about ≤400 g/mol, more preferred about ≥100 g/mol to about ≤300 g/mol.

Second Auxiliary Compound

The ink composition comprises at least one second auxiliary compound, wherein the second auxiliary compound is liquid at about 23° C., and wherein the at least one second auxiliary compound has a chemical structure that is different from the first auxiliary compound and is different from the p-type dopant, preferably the second auxiliary compound is free of a nitrile group and/or is free of an electron withdrawing group.

According to one embodiment of the ink composition, the second auxiliary compound may be selected from the group comprising:
- an alkane compound, such as nonane, decane, undecane, or dodecane;
- an aliphatic alcohol compound, such as hexanol, heptanol, octanol, nonyl alcohol, or decyl alcohol;
- an aliphatic ether compound, such as dibutyl ether, dipentyl ether, diethylene glycol dimethyl ether, diethylene glycol ethyl methyl ether, diethylene glycol isopropyl methyl ether, diethylene glycol diethyl ether, diethylene glycol butyl methyl ether, diethylene glycol dibutyl ether, dipropylene glycol dimethyl ether, dipropylene glycol methyl propyl ether, triethylene glycol dimethyl ether, triethylene glycol ethyl methyl ether, triethylene glycol butyl methyl ether, tripropylene glycol dimethyl ether, or tetraethylene glycol dimethyl ether;
- an aliphatic nitrile compound such as acetonitrile, propionitrile, or butyronitrile;
- an aromatic hydrocarbon compound, such as 1,3-diisopropylbenzene, 1,4 diisopropylbenzene, triisopropylbenzene, pentylbenzene, hexylbenzene, cyclohexylbenzene, heptylbenzene, octylbenzene, or nonylbenzene 3-phenoxy toluene, 2-isopropyl naphthalene, dibenzyl ether, isopropyl biphenyl, or bis dimethyl phenyl ethane;
- a fluorinated hydrocarbon compound such as hydro-fluoro ethers like Methoxy-nonafluorobutane (3M™ Novec™ 7100).

The use of the second auxiliary compound may be advantageous for the ink properties, for the printing properties of the ink and for the drying behavior, film formation and homogeneity of the printed film.

It may be further preferred that the second auxiliary compound has a boiling point at atmospheric pressure which is larger than 50° C., preferably the boiling point of the second auxiliary compound is between 50° C. and 350° C., more preferably between 100° C. and 350° C., more preferred between 150° C. and 350° C.

Water

The ink composition according to a preferred embodiment may be free of water. However the ink composition can comprise water in the range from about ≥0 wt.-% to about ≤5 wt.-%, preferably about ≥0 wt.-% to about ≤1 wt.-%, more preferred about ≥0 wt.-% to about ≤0.1 wt.-% and in addition preferred about ≥0 wt.-% to about ≤0.01 wt.-%; wherein the wt.-% is based on the total weight amount of the ink composition.

The content of water, in particular an excess of water, may destabilize the ink composition. However an ink composition that does not contain water may be a preferred embodiment.

Ink Composition

For an improved processing the ink composition may have at least one of the following physical data According to an embodiment the ink composition may be liquid at a temperature in the range of about 10° C. to 150° C., preferably in the range of about 20° C. to 100° C., further preferred in the range of about 23° C. to 80° C.

According to another embodiment the ink composition may be a solution in the range of about ≥0° C. to about ≤100° C., preferably in the range of about ≥15° C. to about ≤50° C., further preferred in the range of about ≥20° C. to about ≤30° C., and in addition preferred in the range of about ≥21° C. to about ≤23° C.

According to another embodiment the ink composition may have a boiling point of about ≥50° C. to about ≤350° C., preferably of about ≥80° C. to about ≤320° C. and further preferred of about ≥100° C. to about ≤300° C. and in addition preferred ≥150° C. to about ≤250° C.

According to another embodiment the ink composition may have a surface tension at about 23° C. in the range from about ≥15 dyn/cm to about ≤50 dyn/cm, preferably about ≥20 dyn/cm to about ≤40 dyn/cm.

According to another embodiment the ink composition may have a surface tension at about 50° C. in the range from about ≥15 dyn/cm to about ≤50 dyn/cm, preferably about ≥20 dyn/cm to about ≤40 dyn/cm.

In an embodiment the surface tension may be adjusted to low values by the addition of a second auxiliary compound in order to achieve good wetting of the ink on a substrate. For this purpose the second auxiliary compound may be a fluorinated hydrocarbon compound.

According to another embodiment the ink composition may be a homogeneous solution at about 20° C.

According to another embodiment the ink composition may be a homogeneous solution at about 23° C.

According to another embodiment the ink composition may be a homogeneous solution at about 30° C.

According to another embodiment the ink composition may be a homogeneous solution at about 50° C.

According to another embodiment the ink composition may comprise:
- about ≥0.00001 wt.-% to about ≤2 wt.-%, preferably about ≥0.0001 wt.-% to about ≤1.5 wt.-%, further preferred about ≥0.001 wt.-% to about ≤1 wt.-%, further more preferred about ≥0.001 wt.-% to about ≤0.9 wt.-%, and in addition preferred about ≥0.01 wt.-% to about ≤0.5 wt.-%, of the at least one p-type dopant;
- about ≥0.01 wt.-% to about ≤5 wt.-%, preferably about ≥0.1 wt.-% to about ≤4 wt.-%, more preferred about ≥0.5 wt.-% to about ≤3 wt.-% and in addition preferred about ≥0.5 wt.-% to about ≤2 wt.-%, of the at least one first organic charge transport material and/or second organic charge transport material;
- about ≥0.01 wt.-% to about ≤99.97 wt.-%, preferably about ≥0.1 wt.-% to about ≤99.80 wt.-%, more preferred about ≥1 wt.-% to about ≤98 wt.-%, of the at least one first auxiliary compound;
- about ≥0 wt.-% to about ≤99.97 wt.-%, preferably about ≥0.1 wt.-% to about ≤99.80 wt.-%, more preferred about ≥1 wt.-% to about ≤98 wt.-%, of the at least one second auxiliary compound;
- about ≥0 wt.-% to about ≤5 wt.-%, preferably about ≥0 wt.-% to about ≤1 wt.-%, more preferred about ≥0 wt.-% to about ≤0.1 wt.-% and in addition preferred about ≥0 wt.-% to about ≤0.01 wt.-%, of water, preferably the ink composition is free of water;

wherein the wt.-% is based on the total weight of the ink composition, and the total amount of all components does not exceed 100 wt.-%.

According to another embodiment the ink composition may comprise:
- about ≥0.00001 wt.-% to about ≤2 wt.-%, preferably about ≥0.0001 wt.-% to about ≤1.5 wt.-%, further preferred about ≥0.001 wt.-% to about ≤1 wt.-%, and in addition preferred about ≥0.01 wt.-% to about ≤0.5 wt.-%, of the at least one p-type dopant having at least about ≥4 to about ≤50 electron withdrawing groups;
- about ≥0.01 wt.-% to about ≤5 wt.-%, preferably about ≥0.1 wt.-% to about ≤4 wt.-%, more preferred about ≥0.5 wt.-% to about ≤3 wt.-% and in addition preferred about ≥0.5 wt.-% to about ≤2 wt.-%, of the at least one first organic charge transport material having bout ≥0 to about ≤3 electron withdrawing groups and/or second organic charge transport material having at least about ≥0 to about ≤3 electron withdrawing groups, wherein the first organic charge transport material is different from the second organic charge transport material;
- about ≥0.01 wt.-% to about ≤99.97 wt.-%, preferably about ≥0.1 wt.-% to about ≤99.80 wt.-%, more preferred about ≥1 wt.-% to about ≤98 wt.-%, of the at least one first auxiliary compound, which is a nitrile compound that is liquid at 23° C.;
- about ≥0 wt.-% to about ≤99.97 wt.-%, preferably about ≥0.1 wt.-% to about ≤99.80 wt.-%, more preferred about ≥1 wt.-% to about ≤98 wt.-%, of the at least one second auxiliary compound, which is free of an electron withdrawing group selected from the group comprising carbonyl, nitro, fluorine, chlorine, bromine and/or nitrile and is liquid at 23° C.;
- about ≥0 wt.-% to about ≤5 wt.-%, preferably about ≥0 wt.-% to about ≤1 wt.-%, more preferred about ≥0 wt.-% to about ≤0.1 wt.-% and in addition preferred about ≥0 wt.-% to about ≤0.01 wt.-%, of water, preferably the ink composition is free of water;

wherein the wt.-% is based on the total weight of the ink composition, and the total amount of all components does not exceed 100 wt.-%.

According to another embodiment the ink composition may comprise:
- about ≥0.00001 wt.-% to about ≤2 wt.-%, preferably about ≥0.0001 wt.-% to about ≤1.5 wt.-%, further preferred about ≥0.001 wt.-% to about ≤1 wt.-%, and in addition preferred about ≥0.01 wt.-% to about ≤0.5 wt.-%, of the at least one p-type dopant having at least about ≥5 to about ≤50 electron withdrawing groups, which are selected from the group comprising carbonyl, nitro, fluorine, chlorine, bromine and/or nitrile;
- about ≥0.01 wt.-% to about ≤99.97 wt.-%, preferably about ≥0.1 wt.-% to about ≤99.80 wt.-%, more preferred about ≥1 wt.-% to about ≤98 wt.-%, of the at least one first auxiliary compound, which is an aromatic nitrile compound, which is liquid at 23° C.;
- about ≥0 wt.-% to about ≤99.97 wt.-%, preferably about ≥0.1 wt.-% to about ≤99.80 wt.-%, more preferred about ≥1 wt.-% to about ≤98 wt.-%, of the at least one non-aromatic second auxiliary compound, which is free of an electron withdrawing group selected from the group comprising carbonyl, nitro, fluorine, chlorine, bromine and/or nitrile and is liquid at 23° C.;

about ≥0 wt.-% to about ≤5 wt.-%, preferably about ≥0 wt.-% to about ≤1 wt.-%, more preferred about ≥0 wt.-% to about ≤0.1 wt.-% and in addition preferred about ≥0 wt.-% to about ≤0.01 wt.-%, of water, preferably the ink composition is free of water;

wherein the wt.-% is based on the total weight of the ink composition, and the total amount of all components does not exceed 100 wt.-%.

According to another embodiment the ink composition may comprise:

about ≥0.00001 wt.-% to about ≤2 wt.-%, preferably about ≥0.0001 wt.-% to about ≤1.5 wt.-%, further preferred about ≥0.001 wt.-% to about ≤1 wt.-%, and in addition preferred about ≥0.01 wt.-% to about ≤0.5 wt.-%, of the at least one p-type dopant having at least about ≥5 to about ≤50 electron withdrawing groups, which are selected from the group comprising carbonyl, nitro, fluorine, chlorine, bromine and/or nitrile;

about ≥0.01 wt.-% to about ≤5 wt.-%, preferably about ≥0.1 wt.-% to about ≤4 wt.-%, more preferred about ≥0.5 wt.-% to about ≤3 wt.-% and in addition preferred about ≥0.5 wt.-% to about ≤2 wt.-%, of the at least one first organic aromatic charge transport material having bout ≥0 to about ≤3 electron withdrawing groups and/or second organic aromatic charge transport material having at least about ≥0 to about ≤3 electron withdrawing groups, wherein the first organic charge transport material is different from the second organic charge transport material;

about ≥0.01 wt.-% to about ≤99.97 wt.-%, preferably about ≥0.1 wt.-% to about ≤99.80 wt.-%, more preferred about ≥1 wt.-% to about ≤98 wt.-%, of the at least one first auxiliary compound, which is an aromatic nitrile compound, which is liquid at 23° C.;

about ≥0 wt.-% to about ≤99.97 wt.-%, preferably about ≥0.1 wt.-% to about ≤99.80 wt.-%, more preferred about ≥1 wt.-% to about ≤98 wt.-%, of the at least one non-aromatic second auxiliary compound, which is free of an electron withdrawing group selected from the group comprising carbonyl, nitro, fluorine, chlorine, bromine and/or nitrile and is liquid at 23° C.;

about ≥0 wt.-% to about ≤5 wt.-%, preferably about ≥0 wt.-% to about ≤1 wt.-%, more preferred about ≥0 wt.-% to about ≤0.1 wt.-% and in addition preferred about ≥0 wt.-% to about ≤0.01 wt.-%, of water, preferably the ink composition is free of water;

wherein the wt.-% is based on the total weight of the ink composition, and the total amount of all components does not exceed 100 wt.-%.

According to another embodiment the ink composition may comprise:

about ≥0.00001 wt.-% to about ≤2 wt.-%, preferably about ≥0.0001 wt.-% to about ≤1.5 wt.-%, further preferred about ≥0.001 wt.-% to about ≤1 wt.-%, and in addition preferred about ≥0.01 wt.-% to about ≤0.5 wt.-%, of the at least one p-type dopant selected from the group comprising compounds of formula P1 to P25;

about ≥0.01 wt.-% to about ≤5 wt.-%, preferably about ≥0.1 wt.-% to about ≤4 wt.-%, more preferred about ≥0.5 wt.-% to about ≤3 wt.-% and in addition preferred about ≥0.5 wt.-% to about ≤2 wt.-%, of the at least one first organic aromatic charge transport material and a second organic aromatic charge transport material, wherein the molecular weight of the first organic aromatic charge transport material is lower than the molecular weight of the second organic aromatic charge transport material;

about ≥0.01 wt.-% to about ≤99.97 wt.-%, preferably about ≥0.1 wt.-% to about ≤99.80 wt.-%, more preferred about ≥1 wt.-% to about ≤98 wt.-%, of the at least one first auxiliary compound, which is selected from an aromatic nitrile compound that is liquid at 23 C, and preferably selected from tolunitrile and/or benzonitrile;

about ≥0 wt.-% to about ≤5 wt.-%, preferably about ≥0 wt.-% to about ≤1 wt.-%, more preferred about ≥0 wt.-% to about ≤0.1 wt.-% and in addition preferred about ≥0 wt.-% to about ≤0.01 wt.-%, of water, preferably the ink composition is free of water;

wherein the wt.-% is based on the total weight of the ink composition, and the total amount of all components does not exceed 100 wt.-%.

Examples of ink composition in the sense of this inventions are given in Table 4 below.

TABLE 4

Ink compositions that can be suitable used

| Ink | Total solid content | Ink volume | Host 1 | | Host 2 | | p-type dopant | | Solvent 1 | Solvent 2 | Volume ratio solvent 1:solvent 2 |
| --- | --- | --- | --- | --- | --- | --- | --- | --- | --- | --- | --- |
| | | | material | amount | material | amount | material | amount | | | |
| Invink-1 | 2 wt.-% | 1 ml | Polymer-1 | 4.4 mg | Polymer-2 | 11.9 mg | P11 | 4.1 mg | Anisole | Benzonitrile | 5:1 |
| Invink-2 | 2 wt.-% | 1 ml | Polymer-1 | 16.5 mg | — | — | P17 | 4.1 mg | Benzonitrile | — | — |
| Invink-3 | 2 wt.-% | 1 ml | Polymer-2 | 16.2 mg | — | — | P17 | 4.1 mg | Ortho-Tolunitrile | — | — |

Hereinafter, the figures are illustrated in more detail with reference to examples. However, the present disclosure is not limited to the following figures.

The stability of different p-type dopants in the aromatic nitrile solvent and aromatic nitrile free solvents were tested by UV.vis absorption spectroscopy (350 nm to 800 nm wavelength). The absorption is normalized in order to ensure direct comparability between the samples.

Figure 1:
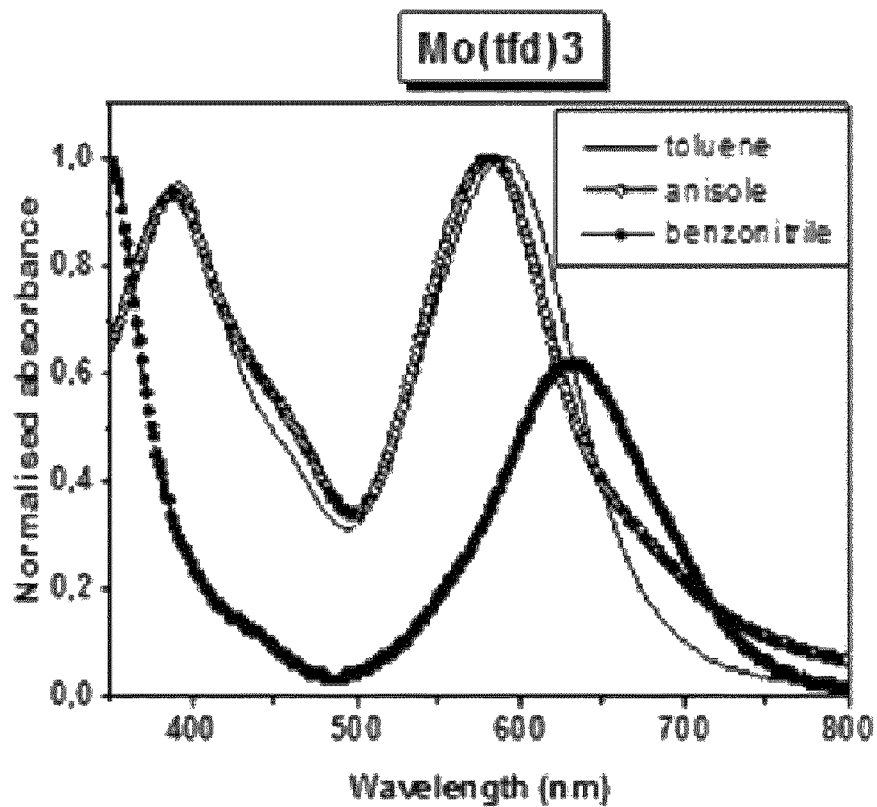
FIG. 1 shows the UV-vis absorption spectrum (350 nm to 800 nm wavelength) at $t_0$ ($t_0$=measured immediately after dissolution) in different solvents of Molybdenum tris-[1,2-bis(trifluoromethyl)ethane-1,2-dithiolene] (Mo(tfd)$_3$) of compound P20.

FIG. 1 shows the UV-vis absorption spectrum (350 nm to 800 nm wavelength) at $t_0$ of Molybdenum tris-[1,2-bis(trifluoromethyl)ethane-1,2-dithiolene] (Mo(tfd)$_3$) of the p-type dopant compound P20:

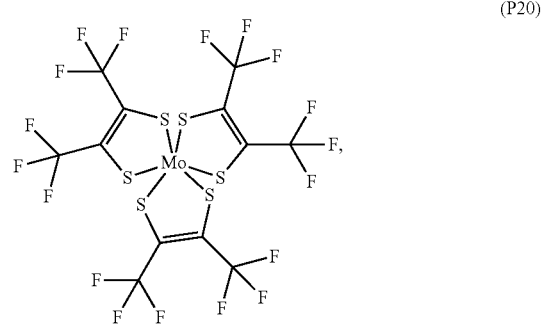

(P20)

in an aromatic nitrile solution, which is benzonitrile, and in aromatic nitrile-free solutions, which are toluene and anisole.

Figure 2:
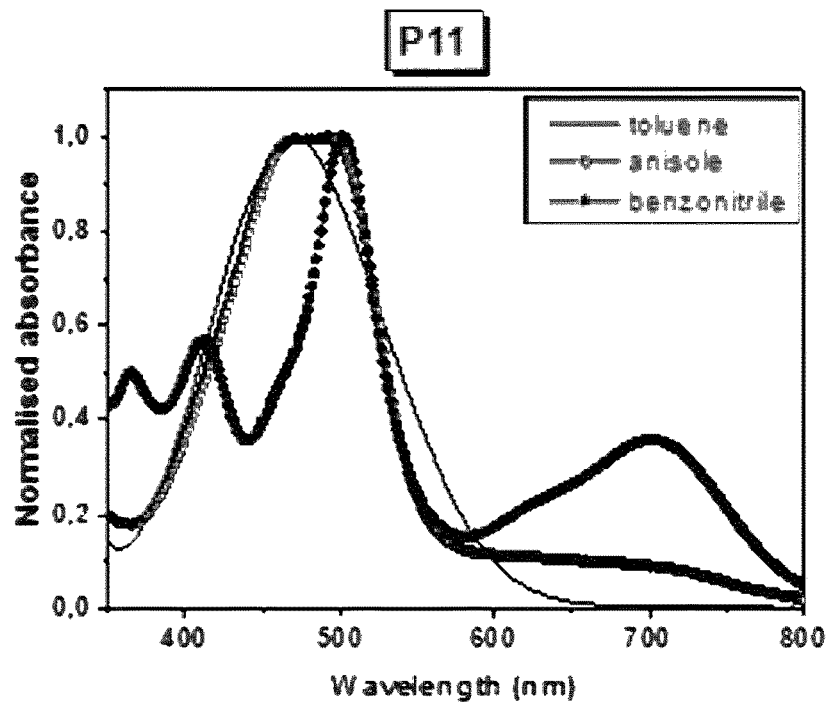
FIG. 2 shows the UV-vis absorption spectrum (350 nm to 800 nm wavelength) at $t_0$ in different solvents of the [3]-radialene compound P11, 4,4',4"-((1E,1'E,1"E)-cyclopropane-1,2,3-triylidenetris(cyanomethanylylidene))tris(2,3,5,6-tetrafluorobenzonitrile)

FIG. 2 shows the UV-vis absorption spectrum (350 nm to 800 nm wavelength) at $t_0$ of the p-type dopant compound P11:

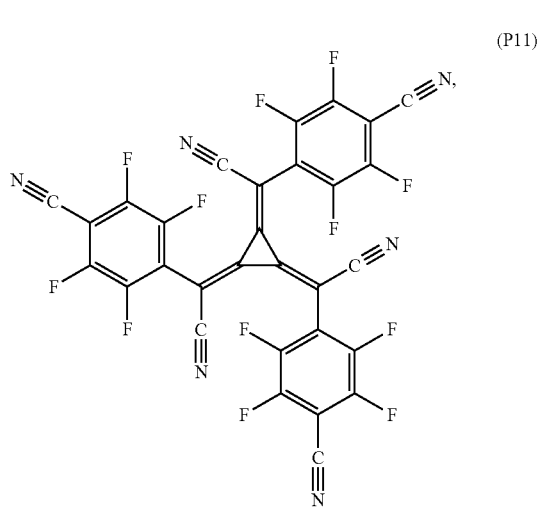 [SMILES: N#CC(=C1C(=C(C#N)c2c(F)c(F)c(C#N)c(F)c2F)C1=C(C#N)c1c(F)c(F)c(C#N)c(F)c1F)c1c(F)c(F)c(C#N)c(F)c1F]

(P11)

in an aromatic nitrile solution, which is benzonitrile, and in aromatic nitrile-free solutions, which are toluene and anisole.

Figure 3:
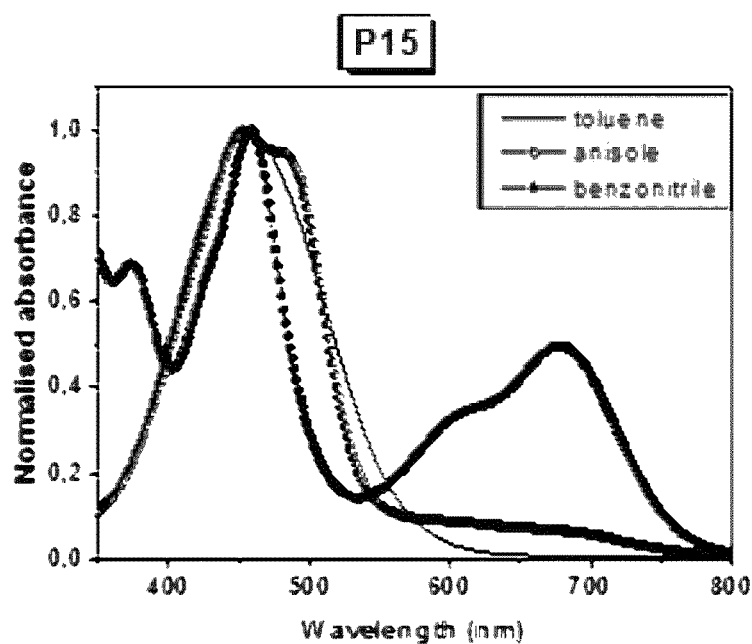
FIG. 3 shows the UV-vis absorption spectrum (350 nm to 800 nm wavelength) at $t_0$ in different solvents of the [3]-radialene of compound P15, 2,2',2"-(cyclopropane-1,2,3-triylidene)tris(2-(2,3,5,6-tetrafluoro-4-(trifluoromethyl)phenyl)-acetonitrile)

FIG. 3 shows the UV-vis absorption spectrum (350 nm to 800 nm wavelength) at $t_0$ of the p-type dopant compound P15:

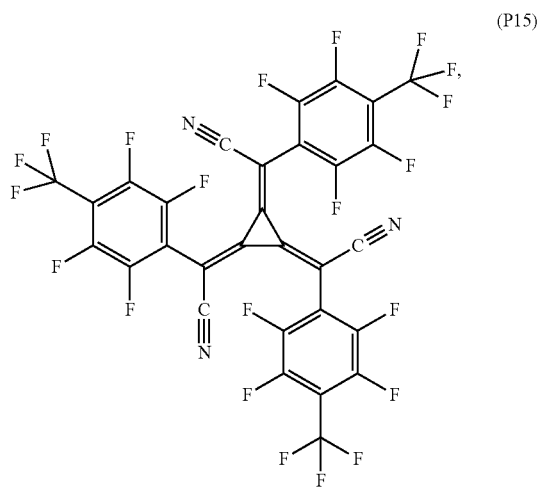 [SMILES: N#CC(=C1C(=C(C#N)c2c(F)c(F)c(C(F)(F)F)c(F)c2F)C1=C(C#N)c1c(F)c(F)c(C(F)(F)F)c(F)c1F)c1c(F)c(F)c(C(F)(F)F)c(F)c1F]

(P15)

in an aromatic nitrile solution, which is benzonitrile, and in aromatic nitrile-free solutions, which are toluene and anisole.

Figure 4:
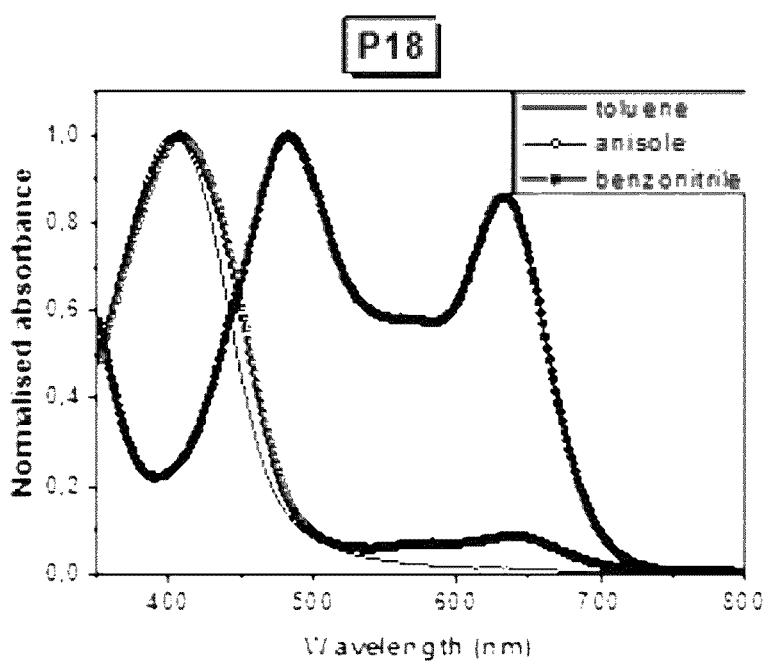
FIG. 4 shows the UV-vis absorption spectrum (350 nm to 800 nm wavelength) at $t_0$ in different solvents of the [3]-radialene compound P18, (2E,2'E,2"E)-2,2',2"-(cyclopropane-1,2,3-triylidene)tris(2-(2,3,5-trifluoro-4,6-bis(trifluoromethyl)phenyl)acetonitrile)

FIG. 4 shows the UV-vis absorption spectrum (350 nm to 800 nm wavelength) at $t_0$ of the p-type dopant compound P18:

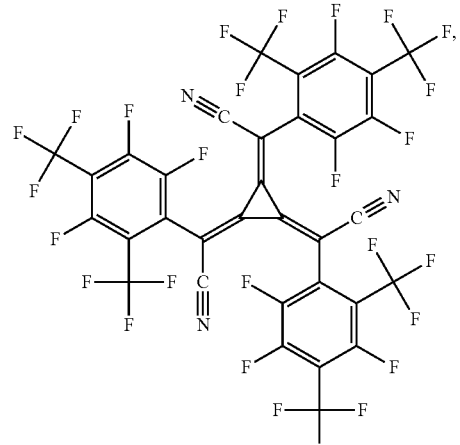

(P18)

in an aromatic nitrile solution, which is benzonitrile, and in aromatic nitrile-free solutions, which are toluene and anisole.

Figure 5:
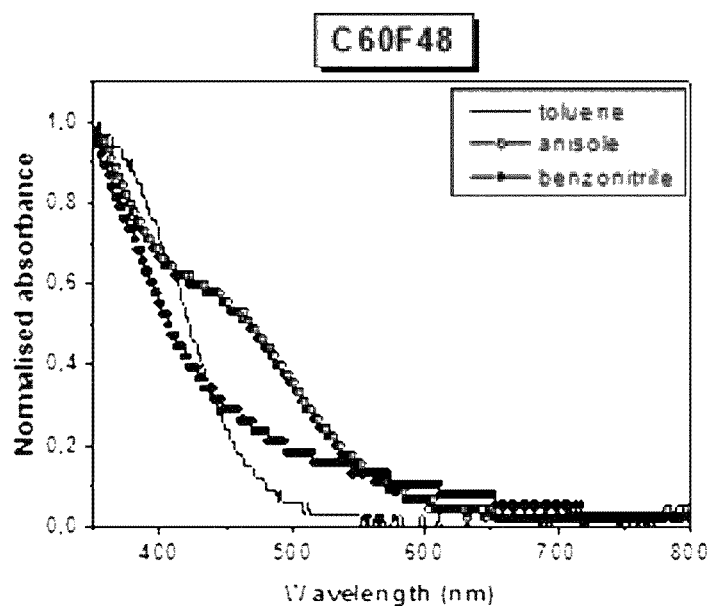
FIG. 5 shows the UV-vis absorption spectrum (350 nm to 800 nm wavelength) at $t_0$ in different solvents of the fluorinated fullerene $C_{60}F_{48}$ of compound P21.

FIG. 5 shows the UV-vis absorption spectrum (350 nm to 800 nm wavelength) at $t_0$ of the p-type dopant fullerene compound $C_{60}F_{48}$ (P21), in an aromatic nitrile solution, which is benzonitrile, and in aromatic nitrile-free solutions, which are toluene and anisole.

Figure 6:
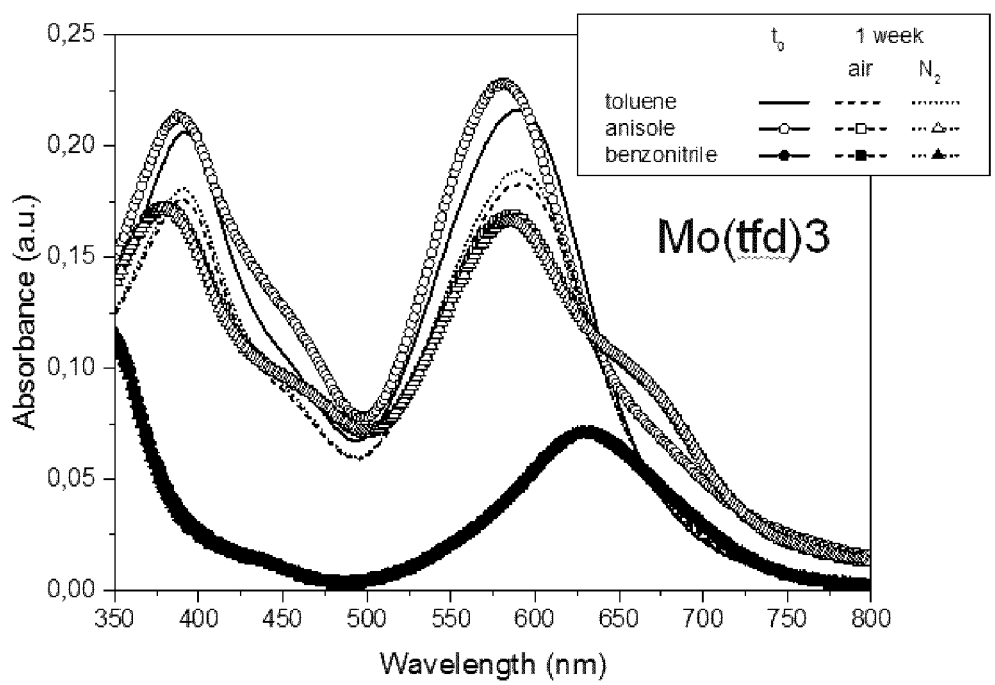
FIG. 6 shows the UV-vis absorption spectrum (350 nm to 800 nm wavelength) after 1 week in different solvents of Molybdenum tris-[1,2-bis(trifluoromethyl)ethane-1,2-dithiolene] (Mo(tfd)$_3$) of compound P20.

FIG. 6 shows the UV-vis absorption spectrum (350 nm to 800 nm wavelength) at $t_0$ and $t_{7d}$ (1 week ink storage) for the p-type dopant compound P20:

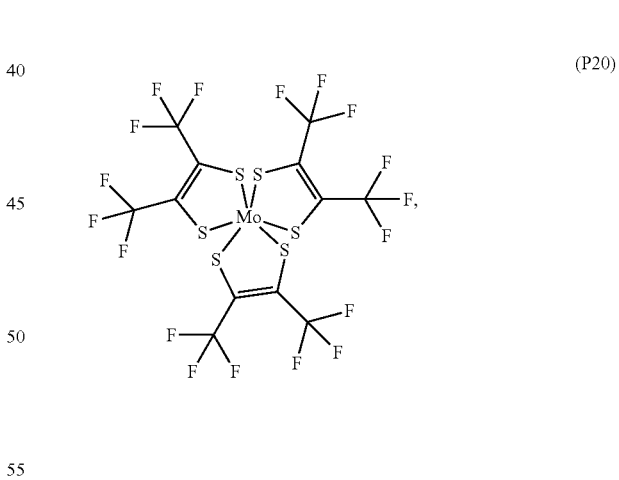

(P20)

under air and under $N_2$ atmosphere in an aromatic nitrile solution, which is benzonitrile, and in aromatic nitrile-free solutions, which are toluene and anisole. It can be seen that the compound P20 is stable over one week in a nitrile-solution, which is benzonitrile. However, P20 is not storage stable over one week in a nitrile free solution, which is toluene and anisole.

Figure 7:
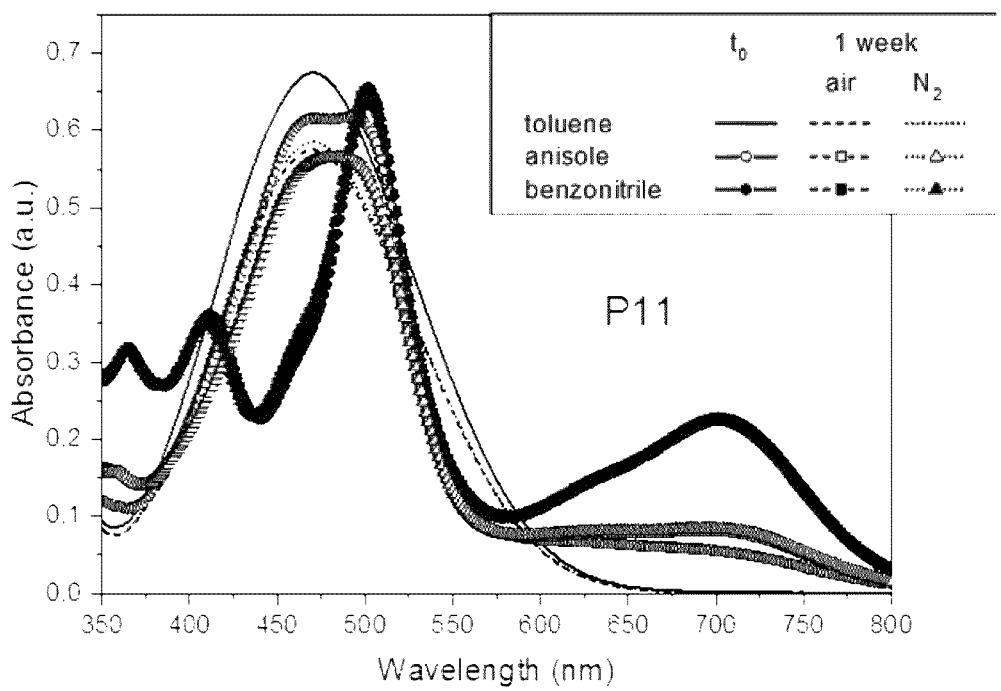
FIG. 7 shows the UV-vis absorption spectrum (350 nm to 800 nm wavelength) after 1 week in different solvents of the [3]-radialene of compound P11, 4,4',4"-((1E,1'E,1"E)-cyclopropane-1,2,3-triylidenetris(cyanomethanylylidene))tris(2,3,5,6-tetrafluorobenzonitrile)

FIG. 7 shows the UV-vis absorption spectrum (350 nm to 800 nm wavelength) at $t_0$ and $t_{7d}$ (1 week ink storage) for the p-type dopant compound P11:

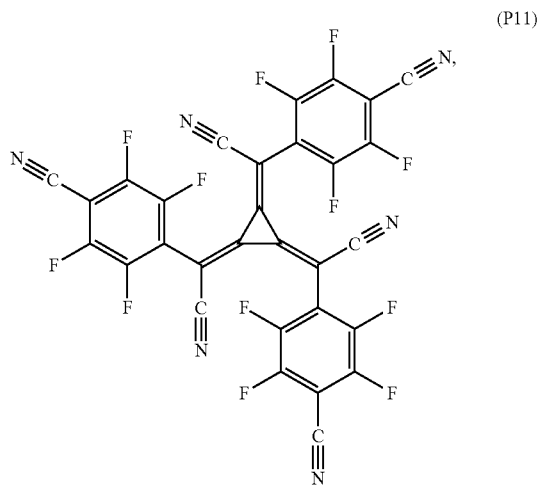 [SMILES: N#CC(=C1C(=C(C#N)c2c(F)c(F)c(C#N)c(F)c2F)C1=C(C#N)c1c(F)c(F)c(C#N)c(F)c1F)c1c(F)c(F)c(C#N)c(F)c1F]

(P11)

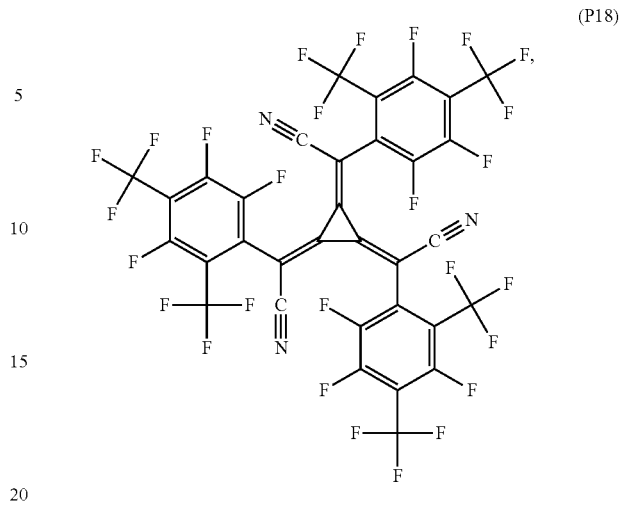

(P18)

under air and under $N_2$ atmosphere in an aromatic nitrile solution, which is benzonitrile, and in aromatic nitrile-free solutions, which are toluene and anisole. It can be seen that the compound P11 is stable over one week in a nitrile-solution, which is benzonitrile. However, P11 is not storage stable over one week in a nitrile free solution, which is toluene and anisole.

Figure 8:
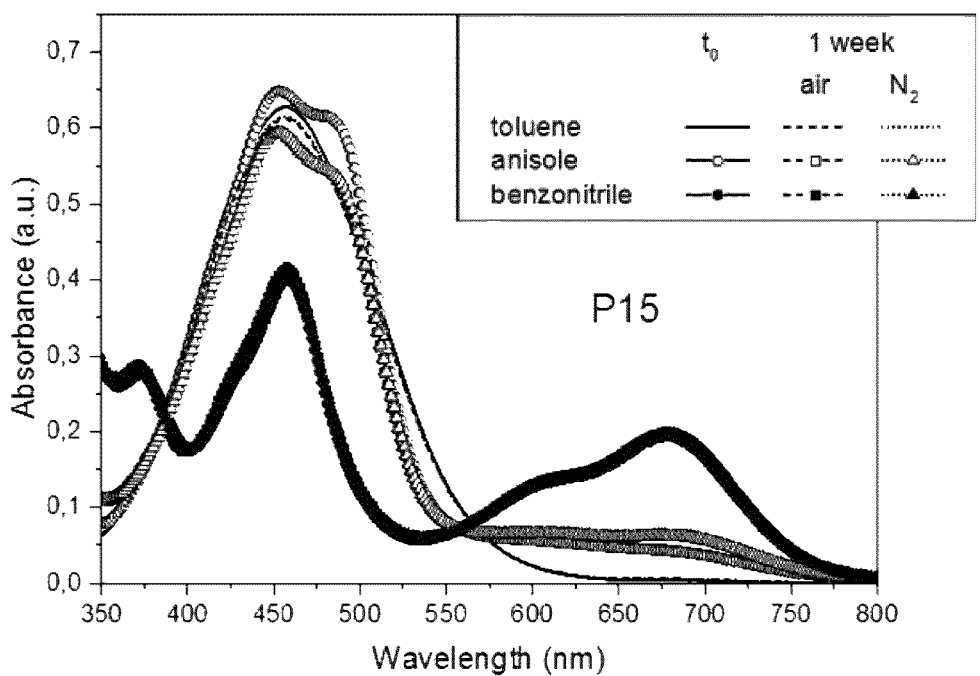
FIG. 8 shows the UV-vis absorption spectrum (350 nm to 800 nm wavelength) after 1 week in different solvents of the [3]-radialene compound P15, 2,2',2"-(cyclopropane-1,2,3-triylidene)tris(2-(2,3,5,6-tetrafluoro-4-(trifluoromethyl)phenyl)-acetonitrile)

FIG. 8 shows the UV-vis absorption spectrum (350 nm to 800 nm wavelength) at $t_0$ and $t_{7d}$ (1 week ink storage) for the p-type dopant compound P15:

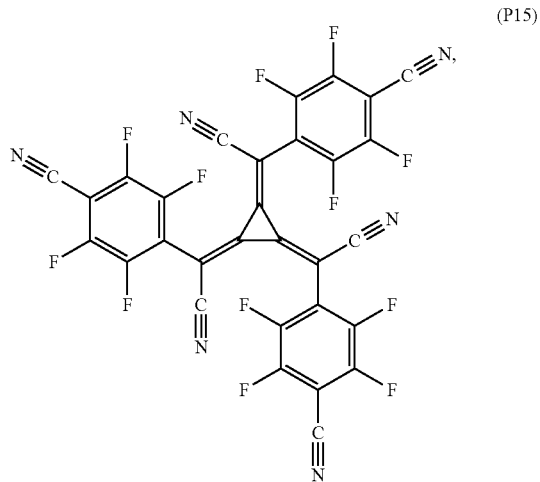 [SMILES: N#CC(=C1C(=C(C#N)c2c(F)c(F)c(C#N)c(F)c2F)C1=C(C#N)c1c(F)c(F)c(C#N)c(F)c1F)c1c(F)c(F)c(C#N)c(F)c1F]

(P15)

under air and under $N_2$ atmosphere in an aromatic nitrile solution, which is benzonitrile, and in aromatic nitrile-free solutions, which are toluene and anisole. It can be seen that the compound P15 is stable over one week in a nitrile-solution, which is benzonitrile. However, P15 is not storage stable over one week in a nitrile free solution, which is toluene and anisole.

Figure 9:
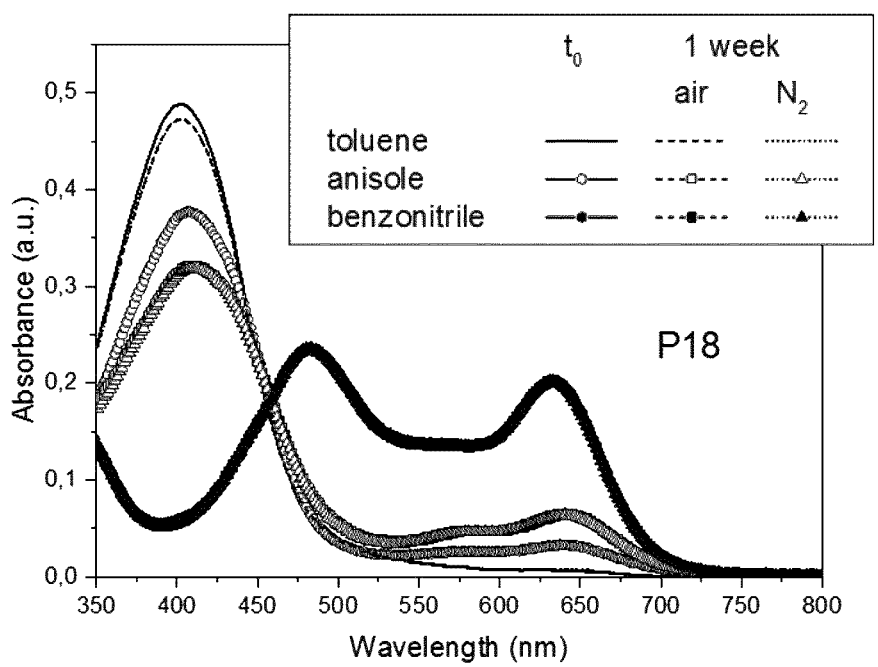
FIG. 9 shows the UV-vis absorption spectrum (350 nm to 800 nm wavelength) after 1 week in different solvents of the [3]-radialene compound P18, (2E,2'E,2"E)-2,2',2"-(cyclopropane-1,2,3-triylidene)tris(2-(2,3,5-trifluoro-4,6-bis(trifluoromethyl)phenyl)acetonitrile)

FIG. 9 shows the UV-vis absorption spectrum (350 nm to 800 nm wavelength) at $t_0$ and $t_{7d}$ (1 week ink storage) for the p-type dopant compound P18:

under air and under $N_2$ atmosphere in an aromatic nitrile solution, which is benzonitrile, and in aromatic nitrile-free solutions, which are toluene and anisole. It can be seen that the compound P18 is stable over one week in a nitrile-solution, which is benzonitrile. However, P18 is not storage stable over one week in a nitrile free solution, which is toluene and anisole.

Figure 10:
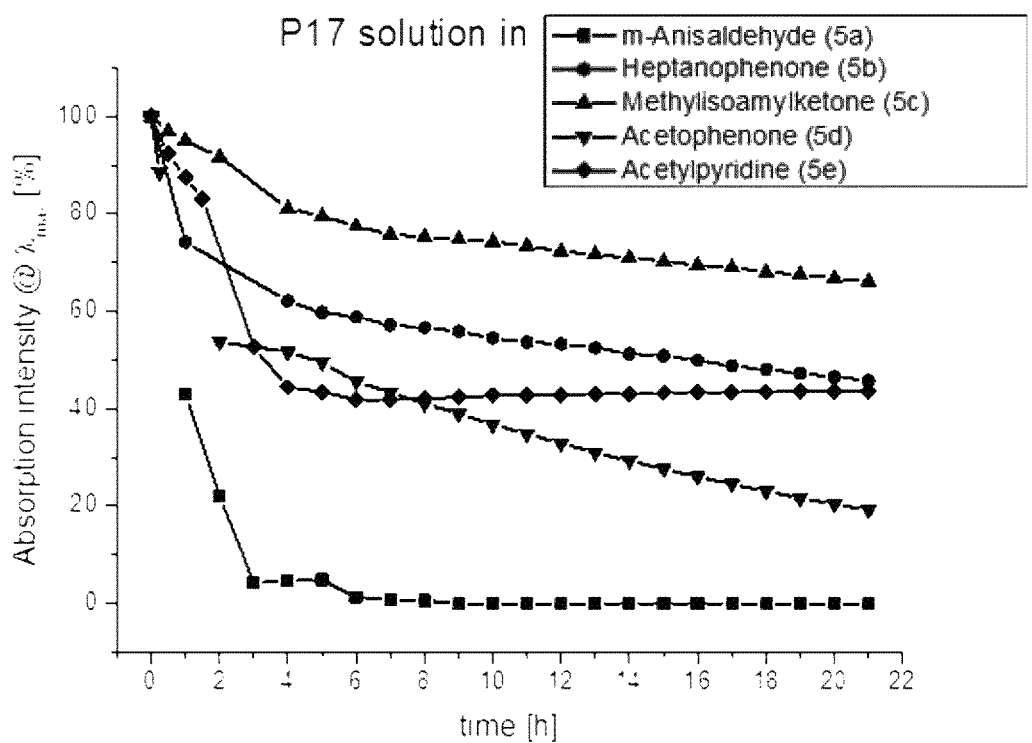
FIG. 10 shows the UV-vis absorption spectrum (350 nm to 800 nm wavelength) with respect to the absorption intensity of [3]-radialene compound P17 in different nitrile-free solvents, comparative examples 5a to 5e, for a time period from to to 22 h ink storage.

FIG. 10 shows the UV-vis absorption spectrum (350 nm to 800 nm wavelength) with respect to the absorption intensity of [3]-radialene p-type dopant compound P17 comparative examples 5a to 5e in different nitrile-free solvents, comparative examples 5a to 5e, for a time period at from t0 for to 22 h ink storage. It is evident that the absorption intensity decreases over time. The decrease of intensity is caused by a reduction of the amount of absorbing compound P17 in the solution. The reduction of the amount of absorbing compound P17 in the solution is attributed to a decomposition of P17 in the solution.

Figure 11:
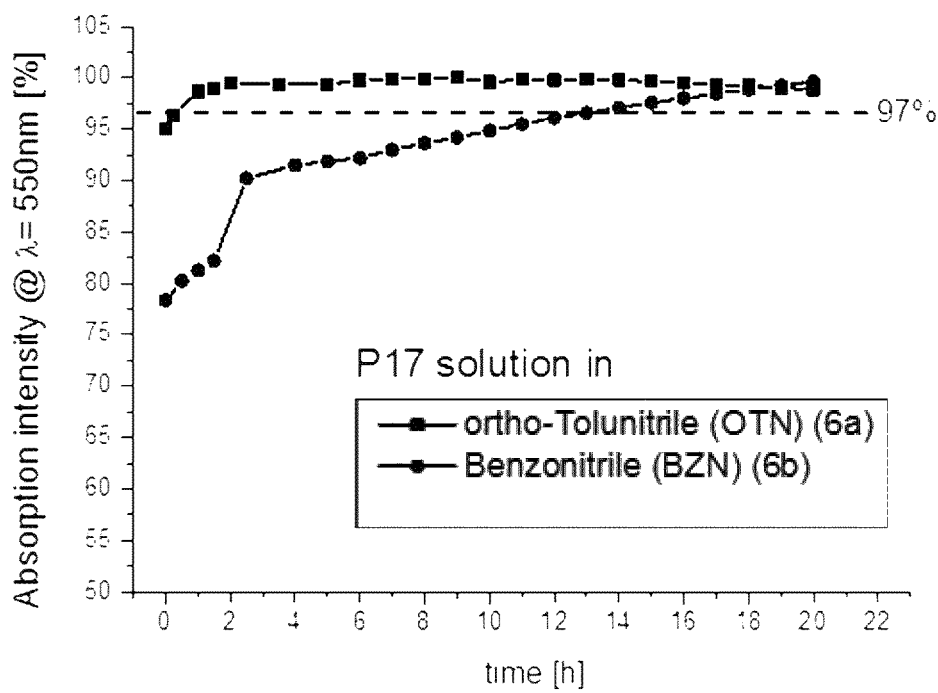
FIG. 11 shows the UV-vis absorption spectrum (350 nm to 800 nm wavelength) with respect to the absorption intensity of the [3]-radialene compound P17 in different nitrile solvents (inventive examples 6a an 6b) for a time period from $t_0$ to 22 h ink storage time.

FIG. 11 shows the UV-vis absorption spectrum (350 nm to 800 nm wavelength) with respect to the absorption intensity of [3]-radialene p-type dopant compound P17 in different nitrile solvents, inventive examples 6a and 6b, for a time period at from t0 for to 22 h ink storage. It is evident that the absorption intensity remains constant at high level (>97%) over time (6a) or increases (6b). Constant absorption intensity (6a) is attributed to constant amount of absorbing compound P17 in the solution over time. P17 is stable in the solution. Increasing absorption intensity (6b) is attributed to increasing amount of absorbing compound P17 in the solution over time. This is indicative of a slow dissolution of P17. After about 17 hours the absorption intensity reaches a constant and high (>97%) level. P17 is stable in the solution.

Figure 12:
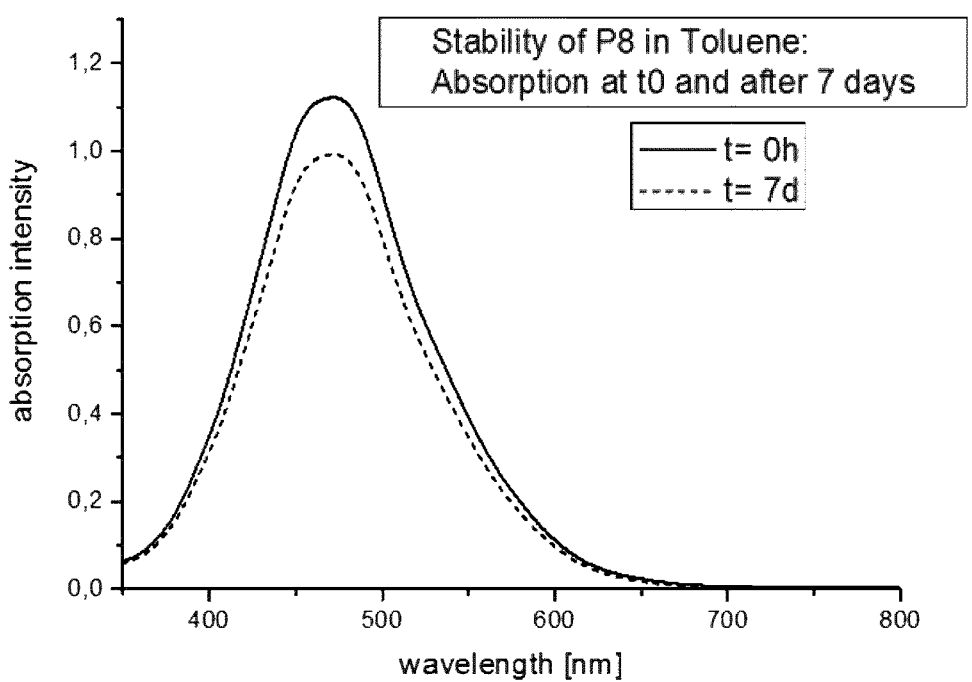
FIG. 12 shows the UV-vis absorption spectrum (350 nm to 800 nm wavelength) with respect to the absorption intensity of compound P8 in toluene (comparative example 7) at $t_0$ and $t_{7d}$ (7 days ink storage time)

FIG. 12 shows the absorption intensity in an UV-vis absorption spectrum (350 nm to 800 nm wavelength) for the p-type dopant compound P8:

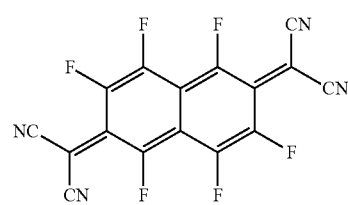 [SMILES: N#CC(C#N)=c1c(F)c(F)c2c(F)c(=C(C#N)C#N)c(F)c(F)c2c1F]

in toluene—comparative example 7—at $t_0$ and $t_{7d}$ (7 days ink storage). The absorption intensity reduces. It can be clearly seen that the compound P8 is not stable over time in a nitrile-free solution, which is toluene.

Figure 13:
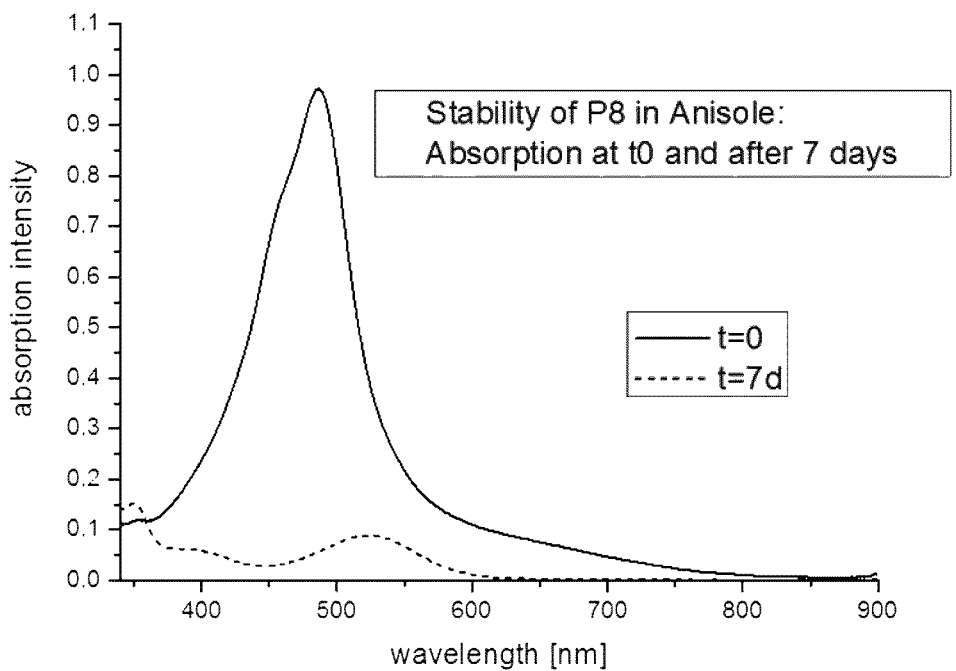
FIG. 13 shows the UV-vis absorption spectrum (350 nm to 800 nm wavelength) with respect to the absorption intensity of compound P8 in anisole (comparative example 8) at $t_0$ and $t_{7d}$ (7 days ink storage time)

FIG. 13 shows the absorption intensity in an UV-vis absorption spectrum (350 nm to 800 nm wavelength) for the p-type dopant compound P8:

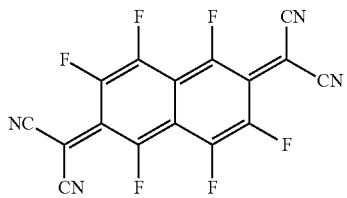

in anisole—comparative example 8—at $t_0$ and $t_{7d}$ (7 days ink storage). The absorption intensity reduces. It can be clearly seen that the compound P8 is not stable over time in a nitrile-free solution, which is anisole.

Figure 14:
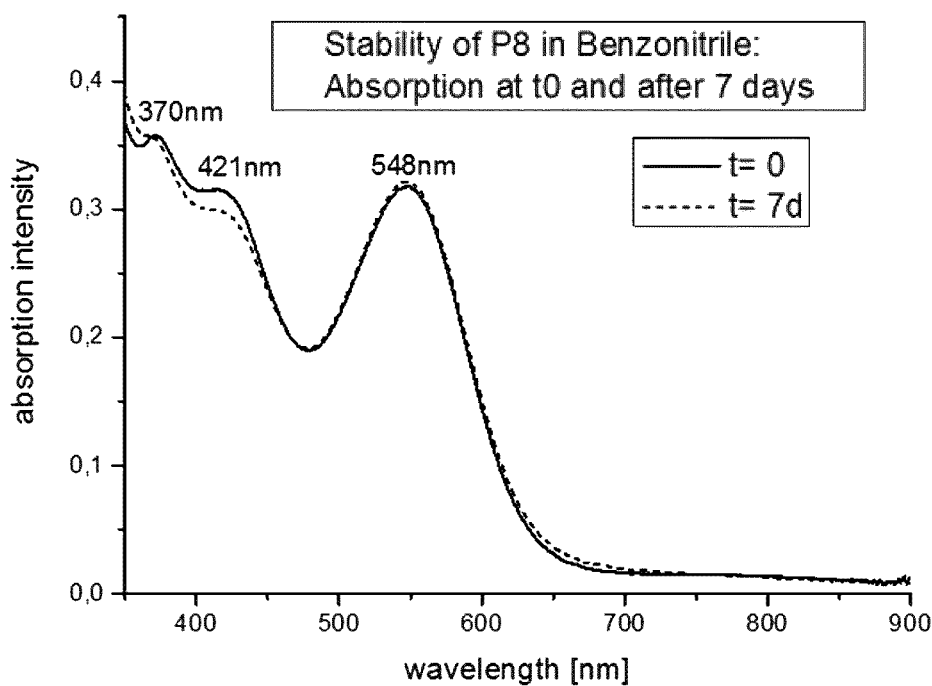
FIG. 14 shows the UV-vis absorption spectrum (350 nm to 800 nm wavelength) with respect to the absorption intensity of the inventive example compound P8 in benzonitrile (inventive example 9) at $t_0$ and $t_{7d}$ (7 days ink storage time)

FIG. 14 shows the absorption intensity in an UV-vis absorption spectrum (350 nm to 800 nm wavelength) for the p-type dopant compound P8:

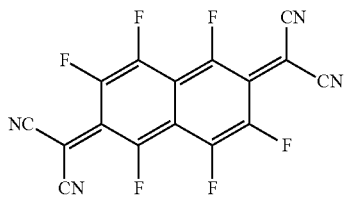 [SMILES: N#CC(C#N)=c1c(F)c(F)c2c(F)c(=C(C#N)C#N)c(F)c(F)c2c1F]

in benzonitrile—inventive example 9—at $t_0$ and $t_{7d}$ (7 days ink storage). The absorption remains constant over time. It can be clearly seen that the compound P8 is stable over time in a nitrile solution, which is benzonitrile.

Figure 15:
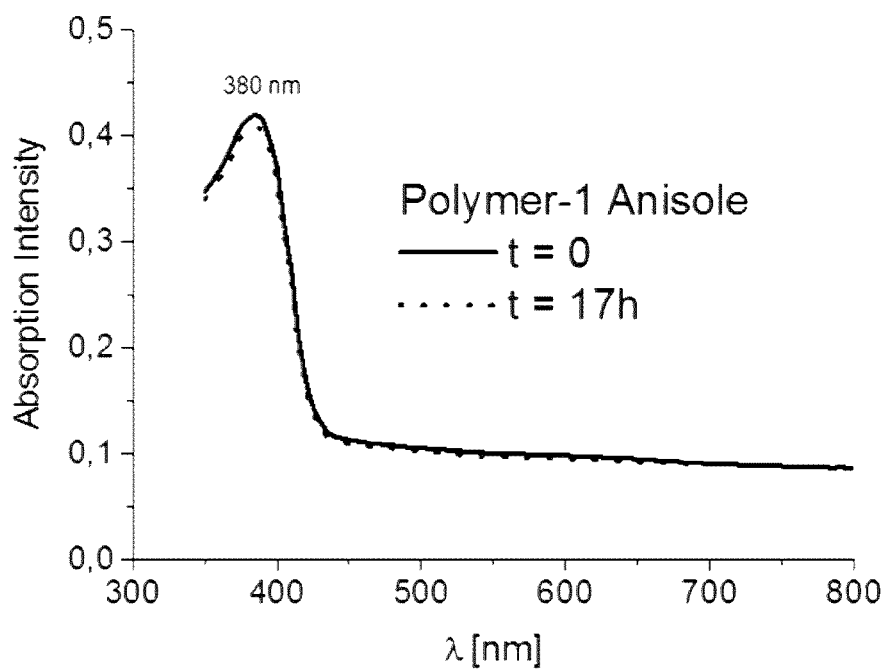
FIG. 15 shows the absorption intensity in an UV-vis absorption spectrum (350 nm to 800 nm wavelength) for the organic charge transport material of polymer-1 in anisole for a time period starts at $t_0$ to $t_{17h}$ (17 h)

FIG. 15 shows the absorption intensity in an UV-vis absorption spectrum (350 nm to 800 nm wavelength) for the organic charge transport material of polymer-1:

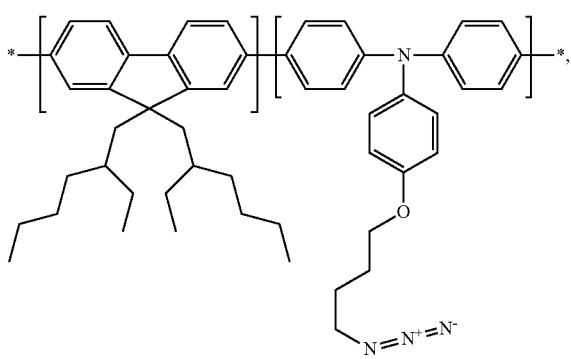

in anisole for a time period starts at $t_0$ to $t_{17h}$ (17 h).

Figure 16:
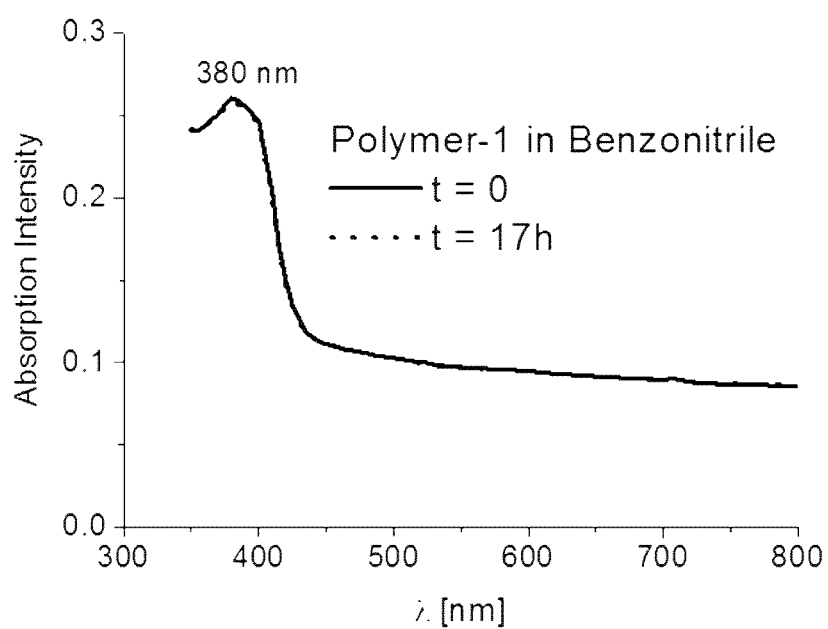
FIG. 16 shows the absorption intensity in an UV-vis absorption spectrum (350 nm to 800 nm wavelength) for the organic charge transport material of polymer-1 in benzonitrile for a time period starts at $t_0$ to $t_{17h}$ (17 h)

FIG. 16 shows the absorption intensity in an UV-vis absorption spectrum (350 nm to 800 nm wavelength) for the organic charge transport material of polymer-1:

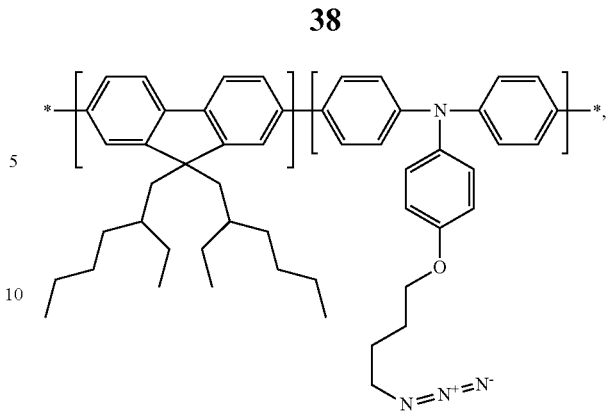

in benzonitrile for a time period starts at $t_0$ to $t_{17h}$ (17 h). FIG. 16 shows that the loss in absorption of the solution of polymer-1 in anisole after 17 h storage at 23° C. is 3%.

FIG. 16 shows that the loss in absorption of the solution of polymer-1 in benzonitrile after 17 h storage at 23° C. is below the resolution limit of the measurement technique which is 0.8%.

Figure 17:
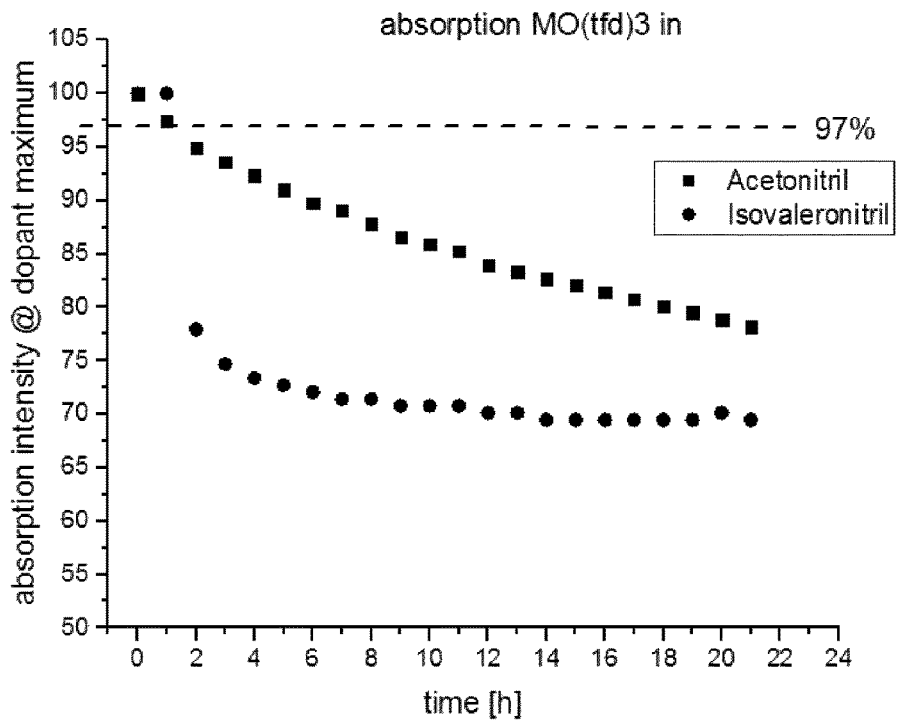
FIG. 17 shows the intensity of the UV-vis absorption maximum at 580 nm of Molybdenum tris-[1,2-bis(trifluoromethyl) ethane-1,2-dithiolene] (Mo(tfd)$_3$) [compound P20] dissolved in acetonitril and isovaleronitril.
Figure 18:
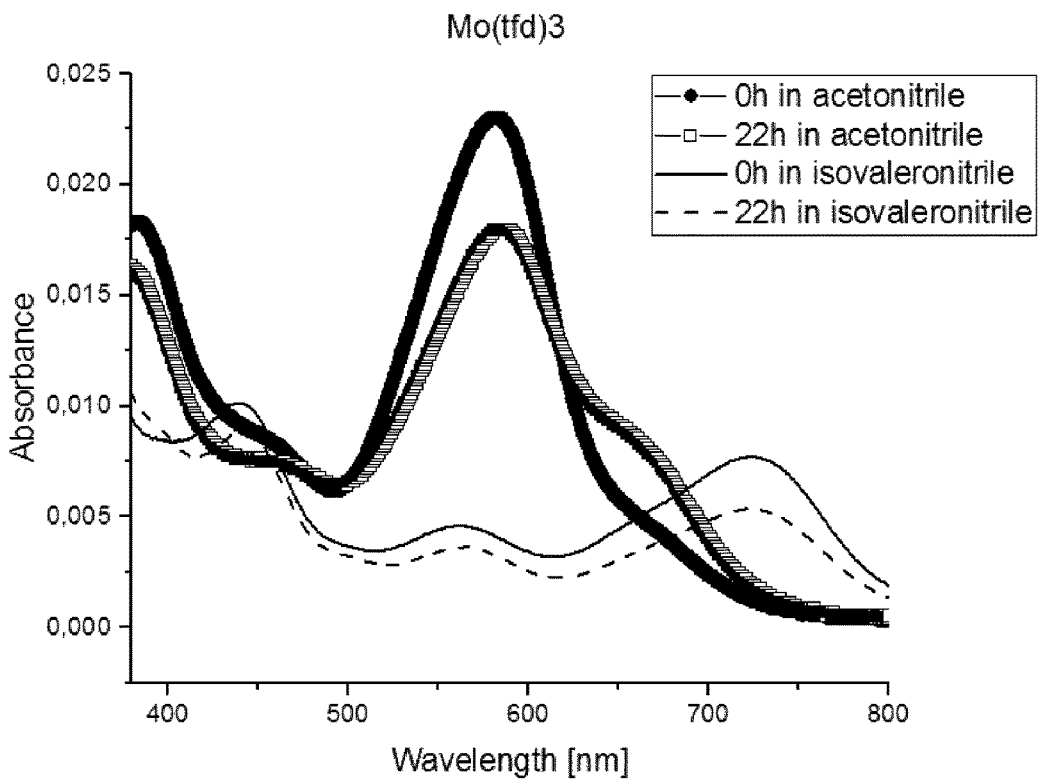
FIG. 18 shows the UV-vis absorption spectrum (350 nm to 800 nm wavelength) at t=0 and t=22 h of Molybdenum tris-[1,2-bis(trifluoromethyl) ethane-1,2-dithiolene] (Mo(tfd)$_3$) [compound P20] in different solvents of acetonitril and isovaleronitril.

FIGS. 17 and 18 clearly demonstrate that a p-type dopant, such as Molybdenum tris-[1,2-bis(trifluoromethyl) ethane-1,2-dithiolene] (Mo(tfd)$_3$) [compound P20], is not stable in a non-aromatic nitrile solution, such as acetonitrile solution or isovaleronitrile solution, compared with an aromatic nitrile solution—see FIG. 6 and FIG. 11.

FIGS. 15 and 16 clearly demonstrate that an organic charge transport material can be stabilized in an aromatic nitrile solution for storage significant better than in a nitrile-free solvent—see FIG. 10 or in a non-aromatic nitrile solution—see FIGS. 17 and 18.

According to Beer's law of Spectrophotometric Analysis (absorbance=e*L*c, with e=molar absorptivity, L=path length of the sample, c=molar concentration of the compound in solution) the absorption intensity is directly proportional to the concentration of the compound in solution. From that it is concluded that 3% of polymer-1 is decomposed in the anisole solution after 17 hours of storage.

Printing Methods

In the sense of this disclosure the layers of the organic electronic devices are processed from the ink composition. The deposition method may be a printing method like ink jet printing, screen printing, offset printing, flexographic printing, spin coating, slot-die coating, spray coating, Langmuir-Blodgett (LB)method.

It may be a coating method like spin coating, slot-die coating, spray coating, or an imprinting method like nano-imprinting.

These methods are to be understood as examples of layer formation by liquid processing. The methods in the sense of processing the disclosed formulation are not limited thereto.

According to one embodiment the ink composition may be processed by solution-processing, preferably by spin coating, slot die coating and/or inkjet printing.

According to another embodiment the method comprises:
forming a layer of an ink composition, preferably by solution-processing, in a pixel cell of an organic electronic device, preferably an organic light-emitting diode pixel bank or solar cell pixel bank, and
allowing the auxiliary compound from the ink composition to evaporate, whereby the organic semiconductor layer is formed.

According to another embodiment the organic semiconductor layer obtained from the ink composition is arranged in direct contact with an anode.

The organic layers that can be obtained by using the ink composition according to the invention, for example by means of a solution processing, may have a layer thickness in the range of about ≥1 nm to about ≤1 µm, preferably of about ≥2 nm to about ≤500 nm, and further preferred of about ≥5 nm to about ≤200 nm.

The organic layers manufactured by the ink composition may have a conductivity sigma of about 1E-7 S/cm≤sigma≤1E1 S/cm.

Electronic Device

The organic layers obtained by using the ink composition according to the invention may be used in an electronic device as follows:
1) The organic layer may be used in an organic light emitting diode (OLED) device on the p-side of the device stack (hole transport region), preferably in direct contact with the anode, as hole injection layer (HIL) to enable efficient injection of positive charge carriers ("holes") of the anode into the adjacent layers of the electronic device.
2) The organic layer may be used in an organic photovoltaic (OPV) device in proximity to—preferably in direct contact with—an electrode as a conductive layer to facilitate efficient extraction of charge carriers from the adjacent layers in the device stack like absorber layer, active layer, hole transport layer into to conductive electrode, which may be the anode or the cathode.
3) The organic layer may be used in organic photovoltaic (OPV) or and organic light emitting diode (OLED) device as "low electrical loss" connecting layer or as part of a "low electrical loss" connecting layer stack between at least two device elements. Such "low electrical loss" connecting layer or "low electrical loss" connecting layer stack may be a p-n-junction or charge generation layer (CGL). The "low electrical loss" connecting layer or "low electrical loss" connecting layer stack may be composed of several layers, preferably of an n-type layer and a p-type layer which may be in direct contact with each other or may be intersected by an interlayer. The organic layer according to the invention is preferably a p-type layer.
4) The organic layer may be used in organic thin film transistors on the transistor electrodes to reduce the contact resistance between the electrode and the layer in direct contact with the electrode.

EXAMPLES

A standard OLED was used to test the inventive ink composition. The layers comprising the inventive OLED devices Inv-OLED-1 to Inv-OLED-4 were deposited sequentially as follows:

ITO/Inventive HIL (40 nm)/HTM-1 (90 nm)/Host-1: Emitter-1 (5 wt %, 20 nm)/n-ETM-1 (30 nm)/LiQ (1 nm)/Al (100 nm)

First, the ITO on a glass substrate was cleaned using clean-room wipe and toluene solvent and subsequently plasma-cleaned. Subsequently, inv-ink1 was deposited by spin coating in a nitrogen glove box using the following recipe: spin step 1: acceleration=2 s, speed=750 rpm, t=5 seconds; spin step 2: acceleration=2 s, speed=1200 rpm, t=30 seconds. The layer was dried on a hot plate at 60° C. for 1 min and subsequently a hard bake for cross-linking was applied for 30 mins at 150° C. All subsequent layers were deposited by vacuum thermal evaporation (VTE) at a pressure of about 1E-7 mbar and a deposition rate of about 1 Angstrom per second for the organic layers and about 3 Angstrom per second for the aluminium cathode layer. The materials deposited by VTE were HTM-1=$N_4,N_4''$-di(naphthalen-1-yl)-N4,N4''-diphenyl-[1,1':4',1''-terphenyl]-4,4''-diamine; Host-1=9-(4-(naphthalen-1-yl)phenyl)-10-(phenyl-d5)anthracene; Emitter-1=Compound BD 23 in KR20110015213; n-ETM-1=2-(4-(9,10-di(naphthalen-2-yl)anthracen-2-yl)phenyl)-1-phenyl-1H-benzo[d]imidazole: LiQ (1:1 wt %).

In examples Inv-OLED-1 to Inv-OLED-4 it is demonstrated that the inventive ink composition has a significant improved stability.

For examples Inv-OLED-1 to Inv-OLED-4 a liquid ink composition, liquid at 23° C., was obtained by mixing the components:

organic charge transport materials of a first organic charge transport material of Polymer-1 (Mn=15458.00 g/mol from GPC/SEC), Mw=23422.00 g/mol from GPC/SEC) and of a second organic charge transport material of Polymer-2 (Mn=17604.00 g/mol from GPC/SEC), Mw=31690.00 g/mol from GPC/SEC);

a p-type dopant P17, benzonitrile anisole.

The solvent volume ratio is anisole:benzonitrile=5:1 vol %. The total solid content in the ink was 2 wt.-%, based on the total weight amount of the ink composition. The content of p-type dopant P17 in the solid HIL-layer is 20 wt %, obtained after the benzonitrile and anisole was removed, and calculated on the total weight amount of the solid HIL-layer.

The ratio between Polymer-1 and Polymer-2 is 3.6:10 by weight.

An HIL-layer was prepared with the obtained ink composition according to the invention for example Inv-OLED-1 at t=0 example, for example Inv-OLED-2 at t=2 weeks, for example Inv-OLED-3 at t=12 weeks and for example Inv-OLED-4 at t=22 weeks, The device performance data of the OLEDs comprising a HIL-layer prepared with the inventive ink according to examples Inv-OLED-1 to Inv-OLED-4 are shown in table 5.

TABLE 5

| Ink | Storage time of inv-ink1 | HIL bake conditions | OLED voltage @15 mA/cm$^2$ | OLED Qeff @15 mA/cm$^2$ | OLED CIEy | OLED LT97 @15 mA/cm$^2$ |
|---|---|---|---|---|---|---|
| Inv-OLED-1 | t = 0 | 2 h @ 180° C. | 4.5 V | 5.9% | 0.14 | 24 h |
| Inv-OLED-2 | t = 2 weeks | 2 h @ 180° C. | 4.4 V | 5.7% | 0.14 | 38 h |
| Inv-OLED-3 | t = 12 weeks | 2 h @ 180° C. | 4.3 V | 5.4% | 0.14 | n.a |
| Inv-OLED-4 | t = 22 weeks | 2 h @ 180° C. | 4.3 V | 5.7% | 0.14 | 34 h |

Excellent storage stability of the ink was demonstrated. The OLED performance does not change for ink storage times of up to 22 weeks.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

Therefore, the aforementioned embodiments should be understood to be exemplary but not limiting the present invention in any way.

The invention claimed is:

1. An ink composition for forming an organic semiconductor layer, wherein the ink composition comprises:
   at least one p-type dopant comprising electron withdrawing groups;
   at least one first auxiliary compound, wherein the first auxiliary compound is an aromatic nitrile compound, wherein the aromatic nitrile compound has about ≥1 to about ≤3 nitrile groups and a melting point of about ≤100° C., wherein the first auxiliary compound is different from the p-type dopant;
   wherein the electron withdrawing groups are fluorine, chlorine, bromine and/or nitrile;
   wherein the ink composition is a homogeneous solution in which the at least one p-type dopant is dissolved by the at least one first auxiliary compound; and
   wherein the ink composition comprises about ≥0.00001 wt.-% to about ≤2 wt.-% of the at least one p-type dopant, based on the total weight of the ink composition.

2. The ink composition according to claim 1, wherein the ink composition comprises:
   at least one p-type dopant comprising electron withdrawing groups, and which is solid at about ≥100° C.;
   at least one organic charge transport material, which is solid at about ≥100° C., and wherein the organic charge transport material is different from the p-type dopant;
   at least one first auxiliary compound, wherein the first auxiliary compound is an aromatic nitrile compound, wherein the aromatic nitrile compound has about ≥1 to about ≤3 nitrile groups and a melting point of about <100° C., wherein the first auxiliary compound is different from the p-type dopant; and
   wherein the electron withdrawing groups are fluorine, chlorine, bromine and/or nitrile.

3. An ink composition according to claim 1, wherein the ink composition comprises:
   at least one p-type dopant, having about ≥4 atoms and wherein the amount of electron withdrawing groups in the sum formula of the at least one p-type dopant is about ≥17 atomic percent to about ≤90 atomic percent;
   at least one organic charge transport material, having about ≥4 atoms and wherein the amount of electron withdrawing groups in the sum formula of the at least one organic charge transport material is ≥0 to about <17 atomic percent and having a melting point of about ≥100° C.;
   at least one first auxiliary compound, wherein the first auxiliary compound is an aromatic nitrile compound, wherein the aromatic nitrile compound has about ≥1 to about ≤3 nitrile groups and a melting point of about <100° C., wherein the first auxiliary compound is different from the p-type dopant; and
   wherein the electron withdrawing groups are fluorine, chlorine, bromine and/or nitrile.

4. The ink composition according to claim 1, wherein the at least one p-type dopant has about ≥3 to about ≤100 electron withdrawing groups.

5. The ink composition according to claim 1, wherein the molecular mass of the p-type dopant is in the range of about ≥60 g/mol to about ≤5000 g/mol.

6. The ink composition according to claim 1, wherein the ink composition comprises at least two organic charge transport materials, of at least a first organic charge transport material and of at least a second organic charge transport material, wherein the molecular mass of the first organic charge transport material is lower than the molecular mass of the second organic charge transport material.

7. The ink composition according to claim 6, wherein
   the average molecular mass of the first organic charge transport material is in the range of about ≥300 g/mol to about ≤1500 g/mol; and/or
   the average molecular mass of the second organic charge transport material is in the range of ≥600 g/mol to about ≤2,000,000;
   wherein the molecular mass of the first organic charge transport material is lower than the molecular mass of the second organic charge transport material.

8. The ink composition according to claim 1, wherein the at least one first auxiliary compound is selected from the group comprising substituted or unsubstituted benzonitrile, alkylbenzonitrile, methylbenzonitrile, ortho-tolunitrile, 4-butyl-benzonitrile, and the substituents are selected from alkyl, aryl or halogen.

9. The ink composition according to claim 1, wherein the molecular mass of the at least one first auxiliary compound is in the range of about ≥100 g/mol to about ≤500 g/mol.

10. The ink composition according to claim 1, wherein the ink composition comprises in addition at least one second auxiliary compound, which is liquid at about 23° C., and wherein the at least one second auxiliary compound has a chemical structure that is different from the first auxiliary compound and is different from the p-type dopant.

11. The ink composition according to claim 10, wherein the at least one second auxiliary compound is selected from the group comprising:
   an alkane compound, such as nonane, decane, undecane, or dodecane;
   an aliphatic alcohol compound, such as hexanol, heptanol, octanol, nonyl alcohol, or decyl alcohol;
   an aliphatic ether compound, such as dibutyl ether, dipentyl ether, diethylene glycol dimethyl ether, diethylene glycol ethyl methyl ether, diethylene glycol isopropyl methyl ether, diethylene glycol diethyl ether, diethylene glycol butyl methyl ether, diethylene glycol dibutyl ether, dipropylene glycol dimethyl ether, dipropylene glycol methyl propyl ether, triethylene glycol dimethyl ether, triethylene glycol ethyl methyl ether, triethylene glycol butyl methyl ether, tripropylene glycol dimethyl ether, or tetraethylene glycol dimethyl ether;
   an aliphatic nitrile compound such as acetonitrile, propionitrile, or butyronitrile;
   an aromatic hydrocarbon compound, such as 1,3-diisopropylbenzene, 1,4-diisopropylbenzene, triisopropylbenzene, pentylbenzene, hexylbenzene, cyclohexylbenzene, heptylbenzene, octylbenzene, or nonylbenzene 3-phenoxy toluene, 2-isopropyl naphthalene, dibenzyl ether, isopropyl biphenyl, or bis dimethyl phenyl ethane
   a fluorinated hydrocarbon compound, such as hydrofluoro ethers or methoxy-nonafluorobutane.

12. The ink composition according to claim 1, wherein the p-type dopant is selected from the group comprising:
   hexaazatriphenylene substituted with at least four nitrile groups;
   cyanobenzoquinone-dimethanes and/or cyanobenzoquinone-diimines, which are substituted with at least four electron withdrawing groups selected from the group comprising fluorine, chlorine, bromine and/or nitrile;
   radialene compounds;
   tris(1-(pyridin-2-yl)-1H-pyrazol)cobalt(III) tris(hexafluorophosphate);

Molybdenum tris-[1,2-bis(trifluoromethyl)ethane-1,2-dithiolene];

$C_{60}F_{48}$;

charge neutral metal amide compounds, which are substituted with at least four electron withdrawing groups selected from the group comprising fluorine, chlorine, bromine and/or nitrile;

metal organic complex.

13. The ink composition according to claim 1, wherein the p-type dopant has the following chemical formula (P1) to (P25):

(P1)
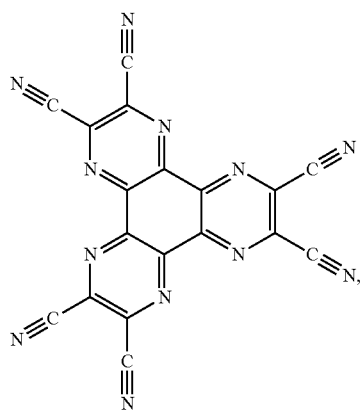

(P2)
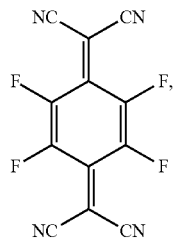

(P3)
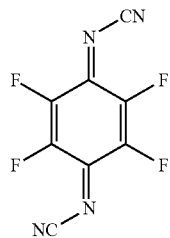

(P4)
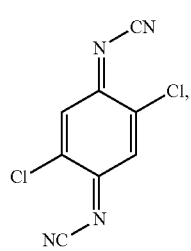

(P5)
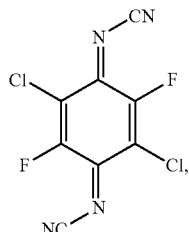

(P6)
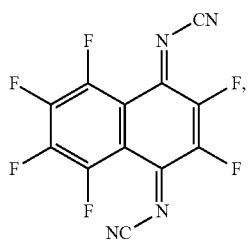

(P7)
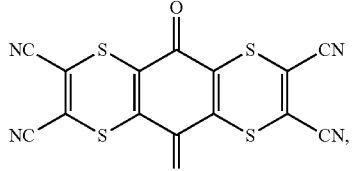

(P8)
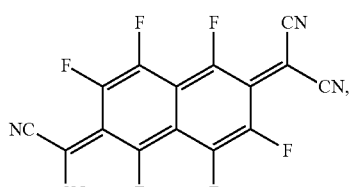

(P9)
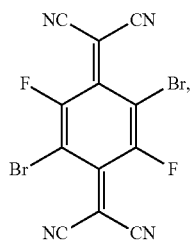

(P10)
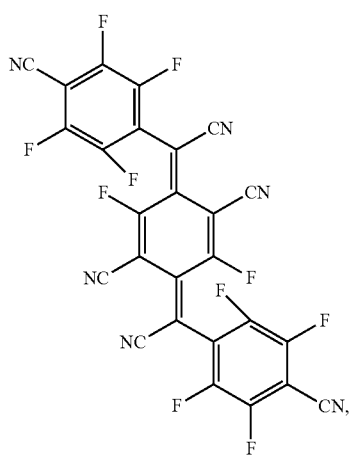

(P11)
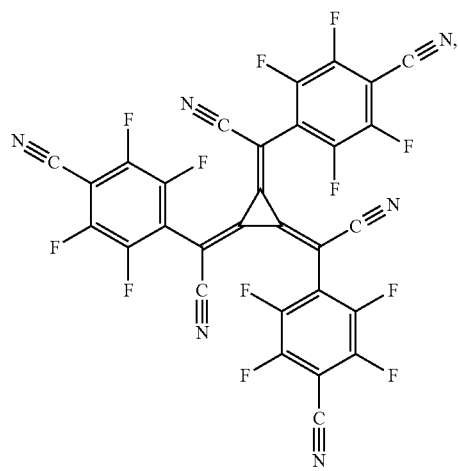
(P12)
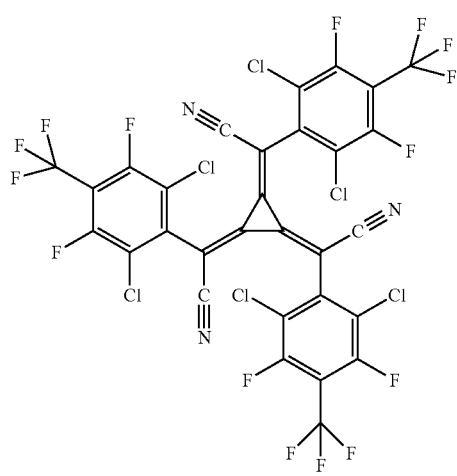
(P13)
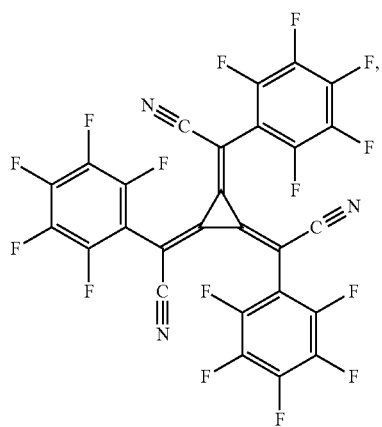
(P14)
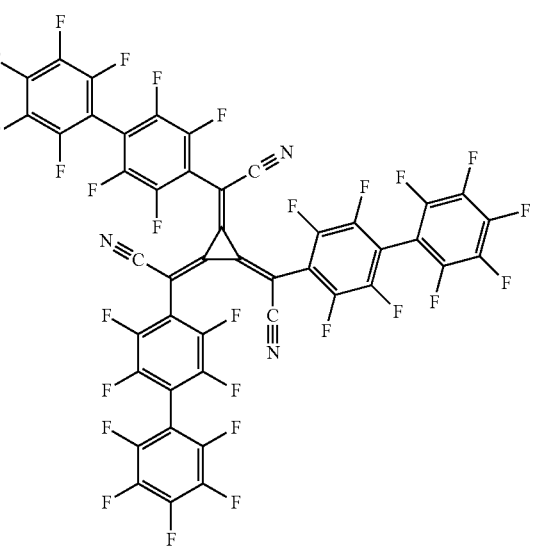
(P15)
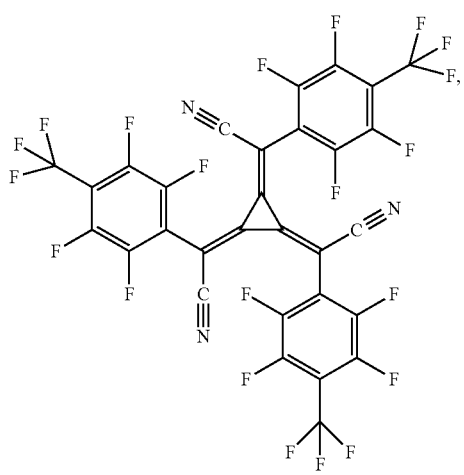
(P16)
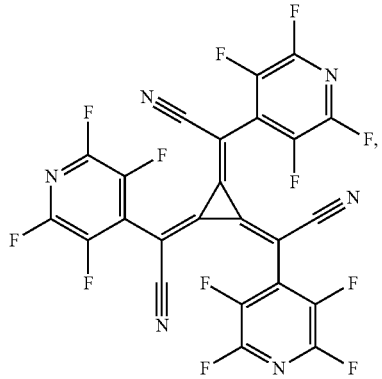

-continued

(17)
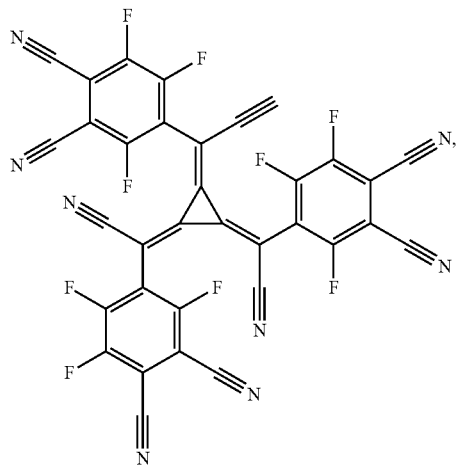

(P18)
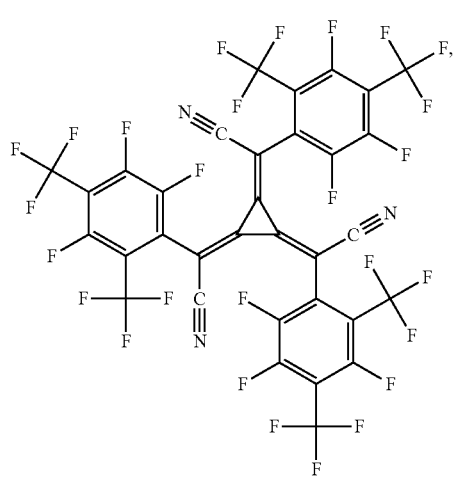

(P19)
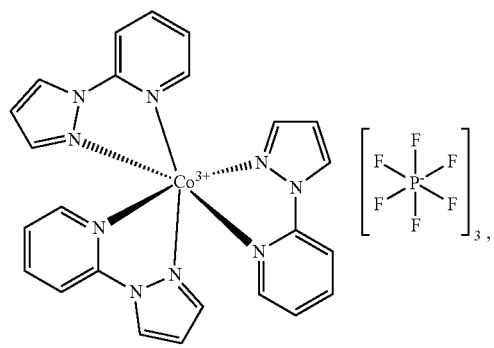

(P20)
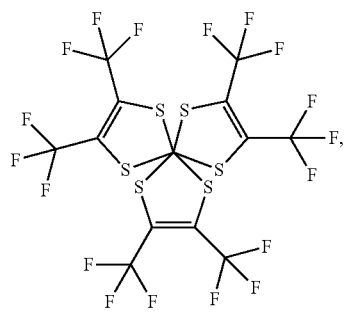

-continued (P21)
$C_{60}F_{48}$, (P22)
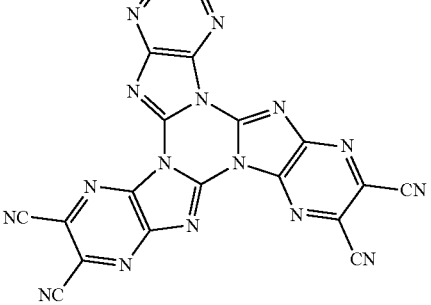

(P23)
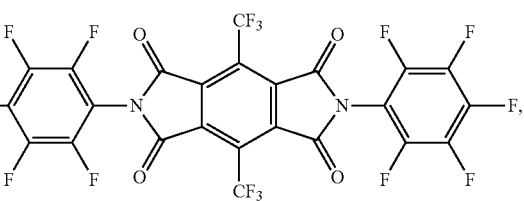

(P24)
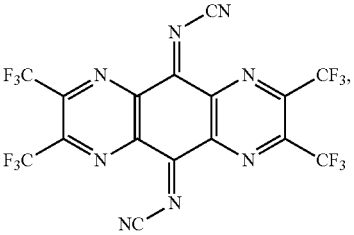

(P25)
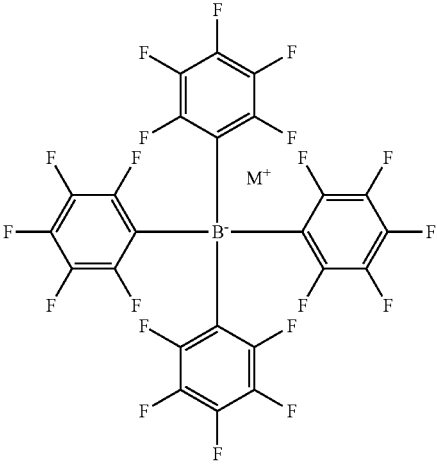

wherein $M^+$ is a monovalent cation.

14. A method of forming an organic semiconductor layer of an organic electronic device, wherein the ink composition according to claim 1 is processed by solution-processing, spin coating, slot die coating and/or inkjet printing.

15. The method of forming an organic semiconductor layer of claim 14, wherein the organic semiconductor layer is arranged in direct contact with the anode.

16. A method of forming an organic semiconductor layer according to claim 14, wherein the method comprises the steps, forming a layer of an ink composition by solution-processing in a pixel cell of an organic electronic device, in an organic light-emitting diode pixel bank or in a solar cell pixel bank, and allowing the auxiliary compounds from the ink composition to evaporate, whereby the organic semiconductor layer is formed.

17. The ink composition according to claim 10, wherein the second auxiliary compound has a boiling point at atmospheric pressure which is ≥50° C. and ≤350° C.

18. The ink composition according to claim 1, wherein the at least one p-type dopant has about ≥4 to about ≤70 electron withdrawing groups.

19. An ink composition for forming an organic semiconductor layer, wherein the ink composition comprises:
  at least one p-type dopant comprising electron withdrawing groups;
  at least one first auxiliary compound, wherein the first auxiliary compound is an aromatic nitrile compound, wherein the aromatic nitrile compound has about ≥1 to about ≤3 nitrile groups and a melting point of about <100° C., wherein the first auxiliary compound is different from the p-type dopant;
  wherein the electron withdrawing groups are fluorine, chlorine, bromine and/or nitrile;
  wherein the ink composition is a homogeneous solution in which the at least one p-type dopant is dissolved by the at least one first auxiliary compound; and
  wherein the ink composition comprises:
    about ≥0.00001 wt.-% to about ≤2 wt.-% of the at least one p-type dopant;
    about ≥0.01 wt.-% to about ≤5 wt.-% of the at least one first organic charge transport material and/or second organic charge transport material;
    about ≥0.01 wt.-% to about ≤99.97 wt.-% of the at least one first auxiliary compound;
    about ≥0 wt.-% to about ≤99.97 wt.-% of the at least one second auxiliary compound;
    about ≥0 wt.-% to about ≤5 wt.-% of water;
  wherein the wt.-% is based on the total weight of the ink composition, and the total amount of all components does not exceed 100 wt.-%.

* * * * *